United States Patent
Patel et al.

(10) Patent No.: US 7,286,278 B2
(45) Date of Patent: Oct. 23, 2007

(54) METHODS FOR DEPOSITING, RELEASING AND PACKAGING MICRO-ELECTROMECHANICAL DEVICES ON WAFER SUBSTRATES

(75) Inventors: Satyadev R. Patel, Sunnyvale, CA (US); Andrew G. Huibers, Palo Alto, CA (US); Steve S. Chiang, Saratoga, CA (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 11/102,204

(22) Filed: Apr. 7, 2005

(65) Prior Publication Data

US 2005/0260792 A1 Nov. 24, 2005

Related U.S. Application Data

(63) Continuation of application No. 10/005,308, filed on Dec. 3, 2001, now Pat. No. 6,969,635.

(51) Int. Cl.
G02B 26/00 (2006.01)
G02B 5/08 (2006.01)
G03B 21/00 (2006.01)
G03B 21/28 (2006.01)
H01L 21/00 (2006.01)

(52) U.S. Cl. .............. 359/290; 359/291; 359/850; 359/295; 359/298; 353/31; 353/50; 353/97; 438/107

(58) Field of Classification Search ........ 359/290–293, 359/295, 298, 223, 214, 230, 231, 850; 438/107; 385/18; 353/31, 50, 97–99; 348/744, 771
See application file for complete search history.

(56) References Cited

U.S. PATENT DOCUMENTS

| | | | |
|---|---|---|---|
| 3,553,364 A | 1/1971 | Lee | |
| 3,600,798 A | 8/1971 | Lee | |
| 3,886,310 A | 5/1975 | Guldberg et al. | |
| 3,896,338 A | 7/1975 | Nathanson et al. | |

(Continued)

FOREIGN PATENT DOCUMENTS

EP 0069226 A2 3/1986

(Continued)

OTHER PUBLICATIONS

Hornbeck, "Digital Light Processing (TM) for High-Brightness, High-Resolution Applications", SPIE Photonics West, EI97, Feb. 1997.

(Continued)

*Primary Examiner*—Loha Ben
(74) *Attorney, Agent, or Firm*—Wade James Brady, III; Frederick J. Telecky, Jr.

(57) ABSTRACT

A method for forming a MEMS device is disclosed, where a final release step is performed just prior to a wafer bonding step to protect the MEMS device from contamination, physical contact, or other deleterious external events. Without additional changes to the MEMS structure between release and wafer bonding and singulation, except for an optional stiction treatment, the MEMS device is best protected and overall process flow is improved. The method is applicable to the production of any MEMS device and is particularly beneficial in the making of fragile micromirrors.

53 Claims, 22 Drawing Sheets

U.S. PATENT DOCUMENTS

| | | | |
|---|---|---|---|
| 4,178,077 A | 12/1979 | Te Velde | |
| 4,309,242 A | 1/1982 | Te Velde | |
| 4,383,255 A | 5/1983 | Grandjean et al. | |
| 4,492,435 A | 1/1985 | Banton et al. | |
| 4,564,836 A | 1/1986 | Vuilleumier et al. | |
| 4,566,935 A | 1/1986 | Hornbeck | |
| 4,573,764 A | 3/1986 | Bradley | |
| 4,592,628 A | 6/1986 | Altman | |
| 4,596,992 A | 6/1986 | Hornbeck | |
| 4,615,595 A | 10/1986 | Hornbeck | |
| 4,662,746 A | 5/1987 | Hornbeck | |
| 4,679,900 A | 7/1987 | McKechnie et al. | |
| 4,701,020 A | 10/1987 | Bradley, Jr. | |
| 4,710,732 A | 12/1987 | Hornbeck | |
| 4,762,393 A | 8/1988 | Gerrotsen et al. | |
| 4,878,122 A | 10/1989 | Glenn | |
| 4,879,602 A | 11/1989 | Glenn | |
| 4,956,619 A | 9/1990 | Hornbeck | |
| 5,028,939 A | 7/1991 | Hornbeck et al. | |
| 5,041,851 A | 8/1991 | Nelson | |
| 5,061,049 A | 10/1991 | Hornbeck | |
| 5,064,277 A | 11/1991 | Blazey et al. | |
| 5,076,661 A | 12/1991 | Bradley | |
| 5,084,807 A | 1/1992 | McKechnie et al. | |
| 5,096,279 A | 3/1992 | Hornbeck et al. | |
| 5,103,302 A | 4/1992 | Yoshida et al. | |
| 5,162,897 A | 11/1992 | Jitsukata et al. | |
| 5,166,824 A | 11/1992 | Nishiguchi et al. | |
| 5,280,277 A | 1/1994 | Hornbeck | |
| 5,289,287 A | 2/1994 | Dargis et al. | |
| 5,293,511 A | 3/1994 | Poradish et al. | |
| 5,321,551 A | 6/1994 | Choi | |
| 5,386,250 A | 1/1995 | Guerinot | |
| 5,410,370 A | 4/1995 | Janssen | |
| 5,420,655 A | 5/1995 | Shimizu | |
| 5,428,408 A | 6/1995 | Stanton | |
| 5,442,414 A | 8/1995 | Janssen et al. | |
| 5,448,314 A | 9/1995 | Heimbuch | |
| 5,453,778 A | 9/1995 | Venkateswar et al. | |
| 5,457,493 A | 10/1995 | Leddy et al. | |
| 5,499,062 A | 3/1996 | Urbanus | |
| 5,504,504 A | 4/1996 | Markandey et al. | |
| 5,508,738 A | 4/1996 | Janssen et al. | |
| 5,510,824 A | 4/1996 | Nelson | |
| 5,526,172 A | 6/1996 | Kanack | |
| 5,527,744 A | 6/1996 | Mignardi et al. | |
| 5,532,763 A | 7/1996 | Janssen et al. | |
| 5,535,047 A | 7/1996 | Hornbeck | |
| 5,537,159 A | 7/1996 | Suematsu et al. | |
| 5,548,301 A | 8/1996 | Kornher et al. | |
| 5,548,347 A | 8/1996 | Melnik et al. | |
| 5,552,924 A | 9/1996 | Tregilgas | |
| 5,552,925 A | 9/1996 | Worley | |
| 5,579,151 A | 11/1996 | Cho | |
| 5,581,393 A | 12/1996 | Min | |
| 5,585,960 A | 12/1996 | Sato et al. | |
| 5,590,943 A | 1/1997 | Yoshida et al. | |
| 5,592,188 A | 1/1997 | Doherty et al. | |
| 5,598,188 A | 1/1997 | Gove et al. | |
| 5,601,351 A | 2/1997 | van den Brandt | |
| 5,608,467 A | 3/1997 | Janssen et al. | |
| 5,608,468 A | 3/1997 | Gove | |
| 5,610,438 A | 3/1997 | Wallace et al. | |
| 5,610,757 A | 3/1997 | Ji et al. | |
| 5,611,611 A | 3/1997 | Ogino et al. | |
| 5,613,748 A | 3/1997 | Yoshida et al. | |
| 5,614,921 A | 3/1997 | Conner et al. | |
| 5,627,580 A | 5/1997 | Nelson | |
| 5,629,794 A | 5/1997 | Magel et al. | |
| 5,629,801 A | 5/1997 | Staker et al. | |
| 5,631,782 A | 5/1997 | Smith | |
| 5,650,881 A | 7/1997 | Hornbeck | |
| 5,654,775 A | 8/1997 | Brennesholtz | |
| 5,657,036 A | 8/1997 | Markandey et al. | |
| 5,659,374 A | 8/1997 | Gale, Jr. et al. | |
| 5,661,591 A | 8/1997 | Lin et al. | |
| 5,668,572 A | 9/1997 | Meyer et al. | |
| 5,680,156 A | 10/1997 | Gove et al. | |
| 5,680,180 A | 10/1997 | Huang | |
| 5,696,619 A | 12/1997 | Knipe et al. | |
| 5,703,728 A | 12/1997 | Smith et al. | |
| 5,706,061 A | 1/1998 | Marshall et al. | |
| 5,708,521 A | 1/1998 | Joen et al. | |
| 5,717,513 A | 2/1998 | Weaver | |
| 5,719,695 A | 2/1998 | Heimbuch | |
| 5,729,386 A | 3/1998 | Hwang | |
| 5,754,217 A | 5/1998 | Allen | |
| 5,757,411 A | 5/1998 | Florence | |
| 5,757,539 A | 5/1998 | Min | |
| 5,771,116 A | 6/1998 | Miller et al. | |
| 5,774,196 A | 6/1998 | Marshall | |
| 5,774,254 A | 6/1998 | Berlin | |
| 5,784,190 A | 7/1998 | Worley | |
| 5,784,212 A | 7/1998 | Hornbeck | |
| 5,793,348 A | 8/1998 | Lee et al. | |
| 5,795,049 A | 8/1998 | Gleckman | |
| 5,796,442 A | 8/1998 | Gove et al. | |
| 5,798,743 A | 8/1998 | Bloom | |
| 5,808,797 A | 9/1998 | Bloom et al. | |
| 5,815,220 A | 9/1998 | Marshall | |
| 5,815,303 A | 9/1998 | Berlin | |
| 5,815,304 A | 9/1998 | Choi | |
| 5,815,641 A | 9/1998 | Marshall | |
| 5,818,545 A | 10/1998 | Takiguchi et al. | |
| 5,825,400 A | 10/1998 | Florence | |
| 5,835,256 A | 11/1998 | Huibers | |
| 5,841,579 A | 11/1998 | Bloom et al. | |
| 5,844,715 A | 12/1998 | Park et al. | |
| 5,845,981 A | 12/1998 | Bradley | |
| 5,860,720 A | 1/1999 | Negishi et al. | |
| 5,862,002 A | 1/1999 | Ji | |
| 5,868,482 A | 2/1999 | Edlinger et al. | |
| 5,870,076 A | 2/1999 | Lee et al. | |
| 5,870,225 A | 2/1999 | Ogino et al. | |
| 5,872,046 A | 2/1999 | Kaeriyama et al. | |
| 5,886,811 A | 3/1999 | Min | |
| 5,892,623 A | 4/1999 | Bradley | |
| 5,905,545 A | 5/1999 | Poradish et al. | |
| 5,909,204 A | 6/1999 | Gale et al. | |
| 5,914,803 A | 6/1999 | Hwang et al. | |
| 5,915,168 A | 6/1999 | Salatino et al. | |
| 5,917,558 A | 6/1999 | Stanton | |
| 5,929,945 A | 7/1999 | Negishi et al. | |
| 5,930,050 A | 7/1999 | Dewald | |
| 5,936,758 A | 8/1999 | Fisher et al. | |
| 5,937,271 A | 8/1999 | Min | |
| 5,939,785 A | 8/1999 | Klonis et al. | |
| 5,943,157 A | 8/1999 | Florence et al. | |
| 5,949,568 A | 9/1999 | Koo et al. | |
| 5,959,598 A | 9/1999 | McKnight | |
| 5,963,289 A | 10/1999 | Stefanov et al. | |
| 5,967,636 A | 10/1999 | Stark et al. | |
| 5,982,553 A | 11/1999 | Bloom et al. | |
| 5,991,079 A | 11/1999 | Furlani et al. | |
| 5,993,007 A | 11/1999 | Jung | |
| 5,999,306 A | 12/1999 | Atobe et al. | |
| 6,002,452 A | 12/1999 | Morgan | |
| 6,004,912 A | 12/1999 | Gudeman | |
| 6,008,785 A | 12/1999 | Hewlett et al. | |
| 6,014,257 A | 1/2000 | Furlani et al. | |
| 6,028,690 A | 2/2000 | Carter et al. | |
| 6,031,652 A | 2/2000 | Furlani et al. | |
| 6,038,056 A | 3/2000 | Florence et al. | |
| 6,038,057 A | 3/2000 | Brazas, Jr. et al. | |

| | | | |
|---|---|---|---|
| 6,046,840 A | 4/2000 | Huibers |
| 6,061,166 A | 5/2000 | Furlani et al. |
| 6,064,404 A | 5/2000 | Aras et al. |
| 6,067,183 A | 5/2000 | Furlani et al. |
| 6,071,616 A | 6/2000 | Sulzbach et al. |
| 6,072,236 A | 6/2000 | Akram et al. |
| 6,084,626 A | 7/2000 | Ramanujan et al. |
| 6,088,102 A | 7/2000 | Manhart |
| 6,101,036 A | 8/2000 | Bloom |
| 6,107,115 A | 8/2000 | Atobe et al. |
| 6,128,125 A | 10/2000 | Gericke et al. |
| 6,130,770 A | 10/2000 | Bloom |
| 6,144,481 A | 11/2000 | Kowarz et al. |
| 6,165,885 A | 12/2000 | Gaynes et al. |
| 6,207,548 B1 | 3/2001 | Akram et al. |
| 6,232,150 B1 | 5/2001 | Lin et al. |
| 6,252,229 B1 | 6/2001 | Hays et al. |
| 6,276,801 B1 | 8/2001 | Fielding |
| 6,282,010 B1 | 8/2001 | Sulzbach et al. |
| 6,287,940 B1 | 9/2001 | Cole et al. |
| 6,288,830 B1 | 9/2001 | Kinoshita |
| 6,303,986 B1 | 10/2001 | Shook |
| 6,323,550 B1 | 11/2001 | Martin et al. |
| 6,348,907 B1 | 2/2002 | Wood |
| 6,351,330 B2 | 2/2002 | Ko et al. |
| 6,353,492 B2 | 3/2002 | McClelland et al. |
| 6,359,669 B1 | 3/2002 | Dehmlow |
| 6,404,534 B1 | 6/2002 | Chin et al. |
| 6,447,126 B1 | 9/2002 | Hornbeck |
| 6,456,281 B1 | 9/2002 | Rindal |
| 6,665,110 B2 | 12/2003 | Pettitt |
| 2001/0007372 A1 | 7/2001 | Akram et al. |
| 2001/0022207 A1 | 9/2001 | Hays et al. |
| 2001/0034076 A1 | 10/2001 | Martin |
| 2002/0005979 A1 | 1/2002 | Bartlett et al. |
| 2002/0056900 A1 | 5/2002 | Liu et al. |
| 2002/0109903 A1 | 8/2002 | Kaeriyama |
| 2003/0008477 A1 | 1/2003 | Kang et al. |

FOREIGN PATENT DOCUMENTS

| | | |
|---|---|---|
| EP | 0877272 A1 | 11/1998 |
| EP | 1097901 A2 | 5/2001 |
| EP | 1101730 A2 | 5/2001 |
| EP | 1167281 A2 | 1/2002 |
| JP | 01-135187 | 5/1989 |
| JP | 07-209594 | 8/1995 |
| JP | 8-23449 | 1/1996 |
| JP | 08-023449 | 3/1996 |
| JP | 08-265672 | 10/1996 |
| JP | 09-500738 | 1/1997 |
| JP | 11-258528 | 9/1999 |
| JP | 2001129800 A | 5/2001 |
| JP | 2001144117 A | 5/2001 |
| JP | 2001196484 A | 7/2001 |
| WO | WO 95/31062 | 11/1995 |
| WO | WO-01/10718 A1 | 2/2001 |
| WO | WO-01/20671 A1 | 3/2001 |
| WO | WO-02/12116 A2 | 2/2002 |
| WO | WO-02/12116 A3 | 2/2002 |
| WO | WO 02/012925 | 2/2002 |

OTHER PUBLICATIONS

Kim et al, "Thin-film Micromirror Array (TMA) for High Luminance and Cost-Competitive Information Display Systems", SID Digest, 1999, pp. 982-985.

Kim et al, "Thin-film Micromirror Array (TMA) for Information Display Systems", Euro Display '99, Berlin.

Gregory et al, "Optical characteristics of a deformable-mirror spatial light modulator", Optics Letters, vol. 13 No. 1, Jan. 1988.

Hornbeck, "From cathode rays to digital micromirrors: A history of electronic projection display technology", TI Technical Journal, Jul.-Sep. 1998, pp. 7-46.

Thomas et al., "The Mirror Matrix Tube: A Novel Light Valve for Projection Displays", IEEE Transactions on Electron Devices, vol. Ed-22 No. 9, Sep. 1975, pp. 765-775.

Brooks, "Micromechanical light modulators for data transfer and processing", SPIE vol. 465, 1984, pp. 46-54.

Hornbeck, "Deformable-Mirror Spatial Light Modulator", SPIE vol. 1150, 1989, pp. 86-102.

Hornbeck, "Digital Light Processing and MEMS: Reflecting the Digital Display Needs of the Networked Society", SPIE vol. 2783, 1996, pp. 2-13.

Sampsell, "Digital micromirror device and its application to projection dispalays", J. Vac. Sci. Technol. B 12(6), Nov./Dec. 1994, pp. 3242-3246.

Mignardi, "Digital micromirror array for projection TV", Solid State Technology, Jul. 1994, pp. 63-68.

Younse et al, "The Digital Micromirror Device (DMD) and Its Transition to HDTV", Proc. of the 13th International Display Research Conf., 1993, pp. 613-616.

Sampsell, "An Overview of the Digital Micromirror Device (DMD) and Its Application to Projection Systems", SID Digest, 1993, pp. 1012-1015.

Hornbeck, "Digital Micromirror Device—Commercialization of a Massively Parallel MEMS Technology", Microelectromechanical Systems (MEMS)—ASME DSC v 62, Nov. 1997, 3-8.

Espinosa et al., "Identification of Residual Stress State in an RF-MEMS Device", MTS Systems Corporation white paper (May 2000).

Franka et al., "Solder Bump Technology: Present and Future", Semiconductor Fabtech (May 1995).

Glenn et al., "Packaging Microscopic Machines", Machine Design (Dec. 7, 2000).

Harsh et al., "Flip-Chip Assembly for Si-Based MEMS", Proceedings of the 1999 IEEE International Conference on Microelectromechanical Systems (MEMS '99), Orlando, FL (Jan. 17-21, 1999), pp. 273-278.

Irwin et al., "Quick Prototyping of Flip Chip Assembly with MEMS", University of Colorado at Boulder white paper (Jul. 17, 2000).

.Irwin et al., "Quick Prototyping of Flip-Chip Assembly with MEMS", portions of slide presentation from the NSF Center for Advanced Manufacturing and Packaging of Microwave, Optical and Digital Electronics at the University of Colorado at Boulder (1998).

Lee et al., "High-Q Tunable Capacitors and Multi-way Switches Using MEMS for Millimeter-Wave Applications", portions of slide presentation from the NSF Center for Advanced Manufacturing and Packaging of Microwave, Optical and Digital Electronics at the University of Colorado at Boulder (Sept. 1998).

Lee et al., "Use of Foundry Services to Prototype MEMS for Millimeter-wave Applications", portions of slide presentation from the NSF Center for Advanced Manufacturing and Packaging of Microwave, Optical and Digital Electronics at the University of Colorado at Boulder (1998).

Luxbacher, T., "Spray Coating for MEMS, Interconnect & Advanced Packaging Applications", HDI Magazine (May 1999) (abstract only).

Moore, D., "Automation Requirements for Die Bonding Process", Electronics Engineer (Jul. 2000).

Tsau, C., "Wafer-Level Packaging", MIT Microsystems Technology Laboratories Annual Report (May 2000), p. 49.

Balaji Sridharan, et al., Post-Packaging Release a New Concept for Surface Micromachined Devices, Mechanical and Aerospace Engineering Department, 4 pgs.

U. Gosele, et al., Wafer Bonding for Microsystems Technologies, Sensors and Actuators 74 (1999) pp. 161-168.

Masao Segawa, et al., A CMOS Image Sensoer Module Applied for a Digital Still Camera Utilizing the Tab on Glass (TOG) Bonding Method, IEEE Transactions on Advanced Packaging, vol. 22., No. 2.

In-Byeong Kang, et al., The Application of Anisotropic Conductive Films for Realisation of Interconnects in Micromechanical Structures, SPIE vol. 3321, pp. 233-238.

Sonja van der Groen, et al., CMOS Compatible Wafer Scale Adhesive Bonding for Circuit Transfer, International Conference on Solid- State Sensors and Actuators, Chicago, Jun. 16-19, 1997, pp. 629-632.

G. Blink, et al., Wafer Bonding with an Adhesive Coating, Part of the SPIE Conference on Micromachined Devices and Components IV, Santa Clara, California ,Sep. 1998, pp. 50-61.

Christine Kallmayer, et al., A New Approach to VHIP Size Package Using Meniscus Soldering and FPC-Bonding, IEEE Transactions on Components Packaging and Manufacturing Technology-Part C., vol. 21, No. 1., Jan. 1998, pp. 51-56.

Joachim Kloeser, et al., Low Cost Bumping by Stencil Printing: Process Qualification for 200 UM Pitch, 1998 International Synposium on Microelectronics, 11 Pgs.

Michel M. Maharbiz, et al., Batch Micropackaging by Conpression-Bonded Wafer-Wafer Transfer, Microassembly Technologies, Inc, 8 Pgs.

Bharat Shivkumar, et al., Microrivets for MEMS Packaging:Concept, Fabriaction, and Strength Testing, Journal of Microlectroomechanical Systems, vol. 6, No. 3, Sep. 1997, pp. 217-224.

Hideki Takagi, et al., Room Temperature Silicon Wafer Direct Bonding in Vacuum by Ar Beam Irradiation, Mechanical Engineering Laboratory, Aist. Miti., 6 Pgs.

Michael H. Beggans, et al., Optical Pressure Sensor Head Fabrication Using Ultra-Thin Silicon Wafer Anodic Bonding, Part of the Symposium on Design, Test, and Microfabrication of MEMS and MOEMs, 10 Pgs.

T.P Glenn, et al., Designing MEMS Into Systems:Packaging Issues, http://www.ecnmag.com, 4 Pgs.

Cadman, New Micromechanical Display Using Thin Metallic Films, IEEE Electron Device Letters vol. EDL-4, No. 1, Jan. 1983.

Colgan, Optimazation of Light-Valve Mirrors, 1996 SID International Symposium—Digest of Technical Papers, vol. 29; Anaheim, CA; May 1998, pp. 1071-1074.

Melcher, High Information Content Projection Display Based on Reflective LC on Silicon Light Valves, 1998 SID International Symposium—Digest of Technical Papers, vol. 29; Anaheim, CA May 1998, pp. 25-28.

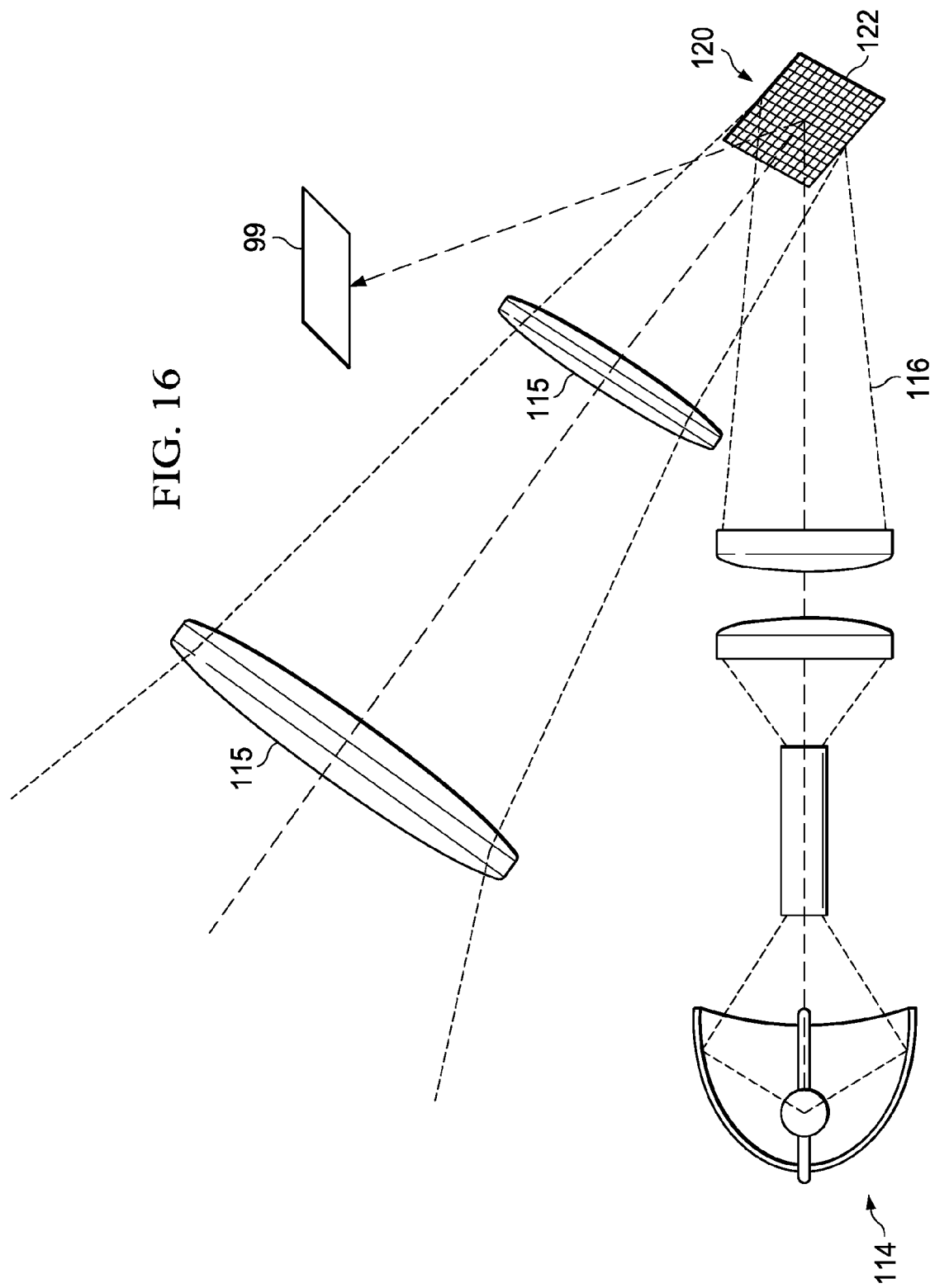

METHODS FOR DEPOSITING, RELEASING AND PACKAGING MICRO-ELECTROMECHANICAL DEVICES ON WAFER SUBSTRATES

CROSS-REFERENCE TO RELATED APPLICATIONS

This is a continuation of U.S. patent application Ser. No. 10/005,308 filed Dec. 3, 2001, now U.S. Pat. No. 6,969,635, the subject matter being incorporated herein by reference.

BACKGROUND OF THE INVENTION

A wide variety of micro-electromechanical devices (MEMS) are known, including accelerometers, DC relay and RF switches, optical cross connects and optical switches, microlenses, reflectors and beam splitters, filters, oscillators and antenna system components, variable capacitors and inductors, switched banks of filters, resonant comb-drives and resonant beams, and micromirror arrays for direct view and projection displays. Though the processes for making the various MEMS devices may vary, they all share the need for high throughput manufacturing (e.g. forming multiple MEMS devices on a single substrate without damage to the microstructures formed on the substrate).

The present invention is in the field of MEMS, and in particular in the field of methods for making micro electromechanical devices on a wafer. The subject matter of the present invention is related to manufacturing of multiple MEMS devices on a wafer, releasing the MEMS structures by removing a sacrificial material, bonding the wafer to another wafer, singulating the wafer assembly, and packaging each wafer assembly portion with one or more MEMS devices thereon, without damaging the MEMS microstructures thereon. More particularly, the invention relates to a method for making a MEMS device where a final release step is performed just prior to a wafer bonding step to protect the MEMS device from contamination, physical contact, or other deleterious external events. A getter or molecular scavenger can be applied to one or both of the wafers before bonding, as can a stiction reducing agent. Except for coating of the MEMS structures to reduce stiction, it is preferred (though not required) that the MEMS structures are not altered physically or chemically (including depositing additional layers or cleaning) between release and wafer bonding.

As disclosed in U.S. Pat. No. 5,061,049 to Hornbeck, silicon wafers are processed to form an array of deflectable beams, then the wafers are diced into chips, followed by further processing of the individual chips. This process has disadvantages, as disclosed in U.S. Pat. No. 5,445,559 to Gale et al. Once the mirror is formed by etching the sacrificial material to form an air gap between the deflectable beam and a lower electrode, the device is very fragile. The device cannot be exposed to liquids during wafer cleanup steps, without destroying the mirror. "Therefore, the devices must be cut and the dicing debris washed away before etching the sacrificial layer away from the mirror. This requires that the cleaning and etching steps, and any following steps, including testing be performed on the individual chips instead of a wafer." To address this problem, Gale et al. propose using a vacuum fixture with a plurality of headspaces above the mirrors to prevent contact with the mirrors. The headspaces are evacuated through vacuum ports and the backside of the wafer is ground down to partially sawn kerfs in order to separate the devices. Then the separated devices and the vacuum fixture are washed to remove any debris from the separation operation. The devices with mirrors exposed are finally ready for packaging.

In U.S. Pat. No. 5,527,744 to Mignardi et al., it is likewise desired to avoid damaging the mirror elements when cutting the wafer into individual dies. In Mignardi et al., a partial saw or scribe is performed on the wafer after optionally putting a removable protective coating over the entire wafer to further limit debris from the partial saw or scribe from settling on the mirrors. Then, the protective coating if used and the debris from the partial saw is removed in a post-saw cleaning. Typically the sacrificial layer is then removed, and additional processes may also take place to cover or protect various surfaces of the device that were not exposed previous to removing the sacrificial layer. Last, in order to separate the wafer into individual devices, tape is aligned and applied to the wafer, covering the partially sawed areas. The wafer is broken and the tape is treated with UV light to weaken it and then is peeled away. The individual devices with exposed mirrors must then be carefully picked and placed off of the saw frame and packaged.

U.S. Pat. No. 5,872,046 to Kaeriyama et al., discloses partially fabricating a micromirror structure on a semiconductor wafer, followed by coating the wafer with a protective layer. Then, streets are sawed in the wafer (defining the individual dies), which is followed by cleaning the wafer with a solution of an alkyl glycol and HF. Further processing includes acoustically vibrating the wafer in deionized water. Finally the mirrors are released and the wafer broken along the streets.

SUMMARY OF THE INVENTION

What is needed in the field of MEMS and MEMS manufacturing is an easier and less expensive way to assemble and ultimately package a mirror array that avoids the problems of the prior art. In the present invention, a method is provided where the mirror elements on the wafer are released (the sacrificial layer is removed) followed by bonding the wafer to another wafer, which is in turn followed by scribing, scoring, cutting, grinding or otherwise separating the wafer into individual dies. By having the mirror elements encased between two wafers prior to any scoring, cutting, etc., the time that the mirrors are exposed is minimized, and there is no need to provide additional protective measures as in the prior art.

A method is thus provided for forming a MEMS device, comprising providing a first wafer, providing a second wafer, forming a sacrificial layer on the first or second wafer, forming a plurality of MEMS elements on the sacrificial layer, releasing the plurality of MEMS devices by etching away the sacrificial layer, mixing one or more spacer elements into an adhesive or providing one or more spacer elements separately from the adhesive for separating the wafers during and after bonding, applying the adhesive to one or both of the first and second wafers, bonding the first and second wafers together with the spacer elements therebetween so that the first and second wafers are held together in a spaced apart relationship as a wafer assembly, singulating the wafer assembly into individual dies, and packaging each die.

In another embodiment of the invention, a method for making a spatial light modulator comprises providing a first wafer; providing a second wafer; forming circuitry and a plurality of electrodes on or in the first wafer; forming a plurality of deflectable elements on or in either the first or second wafer; bonding the first and second wafers together to form a wafer assembly; and separating the wafer assembly into individual wafer assembly dies.

In another embodiment of the invention a method for forming a MEMS device, comprises: providing a first wafer; providing a second wafer; providing a sacrificial layer on or in the first or second wafer; forming a plurality of MEMS elements on the sacrificial layer; releasing the plurality of MEMS devices by etching away the sacrificial layer; mixing one or more spacer elements into an adhesive or providing one or more spacer elements separately from the adhesive for separating the wafers during and after bonding; applying the adhesive to one or both of the first and second wafers; bonding the first and second wafers together with the spacer elements therebetween so that the first and second wafers are held together in a spaced apart relationship as a wafer assembly; and singulating the wafer assembly into individual dies.

In a further embodiment of the invention, a method for making a MEMS device, comprising: providing a first wafer; providing a second wafer; forming circuitry and a plurality of electrodes on or in the first wafer; forming a plurality of deflectable elements on or in either the first or second wafer; applying an adhesion reducing agent and/or a getter to one or both of the wafers; aligning the first and second wafers; bonding the first and second wafers together to form a wafer assembly; and separating the wafer assembly into individual wafer assembly dies.

In a still further embodiment of the invention, a method for making a MEMS device, comprising: providing a wafer; providing a plurality of substrates that are transmissive to visible light, each smaller than said wafer, each substrate having a frame portion that is not transmissive to visible light; forming circuitry and a plurality of electrodes on or in the wafer; forming a plurality of deflectable elements on or in the wafer; aligning the substrates with the wafer; bonding the substrates and wafer together to form a wafer assembly; and separating the wafer assembly into individual wafer assembly dies.

BRIEF DESCRIPTION OF THE DRAWINGS

FIG. 11A is a cross sectional view taken along line 11-11 of FIG. 10 upon alignment of the two wafers of FIGS. 10A and 10B, but prior to bonding, whereas

FIG. 16 schematically illustrates another exemplary display system of the invention;

DETAILED DESCRIPTION OF THE EMBODIMENTS

Mirror Fabrication:

Processes for microfabricating a MEMS device such as a movable micromirror and mirror array are disclosed in U.S. Pat. Nos. 5,835,256 and 6,046,840 both to Huibers, the subject matter of each being incorporated herein by reference. A similar process for forming MEMS movable elements (e.g. mirrors) on a wafer substrate (e.g. a light transmissive substrate or a substrate comprising CMOS or other circuitry) is illustrated in FIGS. 1 to 4. By "light transmissive", it is meant that the material will be transmissive to light at least in operation of the device (The material could temporarily have a light blocking layer on it to improve the ability to handle the substrate during manufacture, or a partial light blocking layer for decreasing light scatter during use. Regardless, a portion of the substrate, for visible light applications, is preferably transmissive to visible light during use so that light can pass into the device, be reflected by the mirrors, and pass back out of the device. Of course, not all embodiments will use a light transmissive substrate). By "wafer" it is meant any substrate on which multiple microstructures or microstructure arrays are to be formed and which allows for being divided into dies, each die having one or more microstructures thereon. Though not in every situation, often each die is one device or product to be packaged and sold separately. Forming multiple "products" or dies on a larger substrate or wafer allows for lower and faster manufacturing costs as compared to forming each die separately. Of course the wafers can be any size or shape, though it is preferred that the wafers be the conventional round or substantially round wafers (e.g. 4", 6" or 12" in diameter) so as to allow for manufacture in a standard foundry.

Figure 1A:
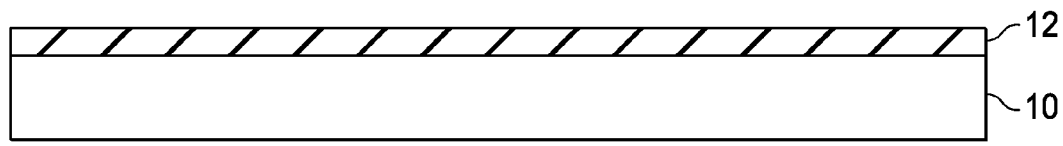
FIGS. 1A to 1E are cross sectional views illustrating one method for forming micromirrors.

FIGS. 1A to 1E show a manufacturing process for a micromechanical mirror structure. As can be seen in FIG. 1A, a substrate such as glass (e.g. 1737F), quartz, Pyrex™, sapphire, (or silicon alone or with circuitry thereon) etc. is provided. The cross section of FIGS. 1A-E is taken along line 1-1 of FIG. 2. Because this cross section is taken along the hinge of the movable element, an optional block layer 12 can be provided to block light (incident through the light transmissive substrate during use) from reflecting off of the hinge and potentially causing diffraction and lowering the contrast ratio (if the substrate is transparent).

Figure 1B:
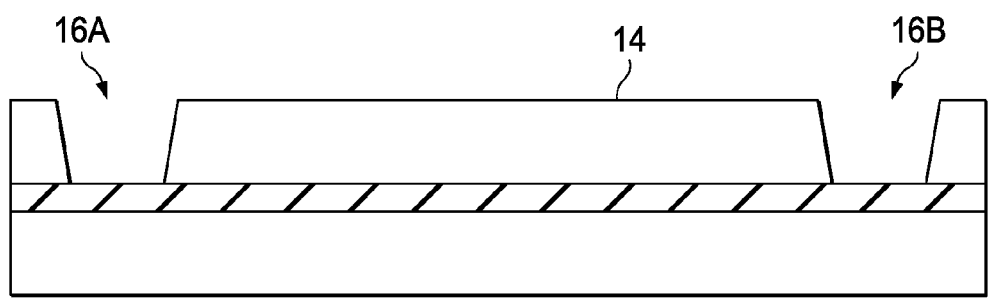

As can be seen in FIG. 1B, a sacrificial layer 14, such as amorphous silicon, is deposited. The thickness of the sacrificial layer can be wide ranging depending upon the movable element/mirror size and desired tilt angle, though a thickness of from 500 Å to 50,000 Å, preferably around 5000 Å is preferred. Alternatively the sacrificial layer could be a polymer or polyimide (or even polysilicon, silicon nitride, silicon dioxide, etc. depending upon the materials selected to be resistant to the etchant, and the etchant selected). A lithography step followed by a sacrificial layer etch forms holes 16a,b in the sacrificial silicon, which can be any suitable size, though preferably having a diameter of from 0.1 to 1.5 um, more preferably around 0.7+/−0.25 um. The etching is performed down to the glass/quartz substrate or down to the block layer if present. Preferably if the glass/quartz layer is etched, it is in an amount less than 2000 Å.

Figure 1C:
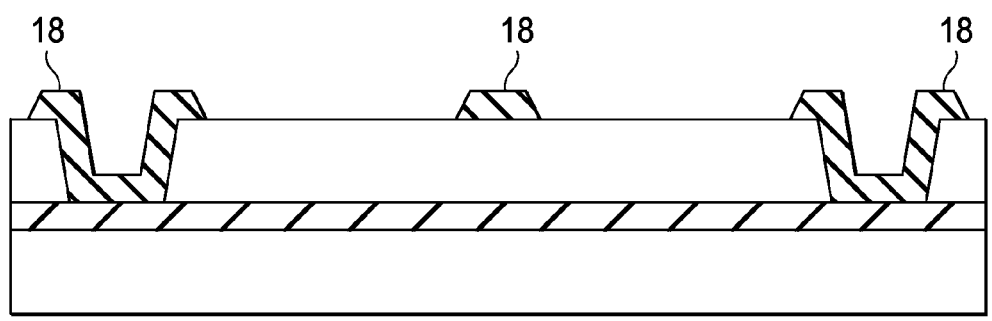

At this point, as can be seen in FIG. 1C, a first layer 18 is deposited by chemical vapor deposition. Preferably the material is silicon nitride or silicon oxide deposited by LPCVD or PECVD, however polysilicon, silicon carbide or an organic compound could be deposited at this point—or Al, CoSiNx, TiSiNx, TaSiNx and other ternary and higher compounds as set forth in U.S. patent application Ser. No. 09/910,537 filed Jul. 20, 2001, now U.S. Pat. No. 7,057,246, and 60/300,533 filed Jun. 22, 2001 both to Reid and incorporated herein by reference (of course the sacrificial layer and etchant should be adapted to the material used). The thickness of this first layer can vary depending upon the movable element size and desired amount of stiffness of the element, however in one embodiment the layer has a thickness of from 100 to 3200 Å, more preferably around 1100 Å. The first layer undergoes lithography and etching so as to form gaps between adjacent movable elements on the order of from 0.1 to 25 um, preferably around 1 to 2 um.

Figure 1D:
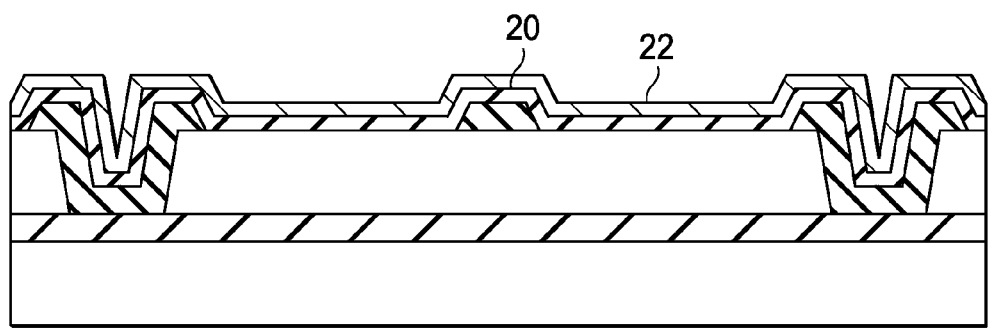

A second layer 20 (the "hinge" layer) is deposited as can be seen in FIG. 1D. By "hinge layer" it is meant the layer that defines that portion of the device that flexes to allow movement of the device. The hinge layer can be disposed only for defining the hinge, or for defining the hinge and other areas such as the mirror. In any case, the reinforcing material is removed prior to depositing the hinge material. The material for the second (hinge) layer can be the same (e.g. silicon nitride) as the first layer or different (silicon oxide, silicon carbide, polysilicon, or Al, CoSiNx, TiSiNx, TaSiNx or other ternary and higher compounds) and can be deposited by chemical vapor deposition as for the first layer. The thickness of the second/hinge layer can be greater or less than the first, depending upon the stiffness of the movable element, the flexibility of the hinge desired, the material used, etc. In one embodiment the second layer has a thickness of from 50 Å to 2100 Å, and preferably around 500 Å. In another embodiment, the first layer is deposited by PECVD and the second layer by LPCVD.

Figure 1E:
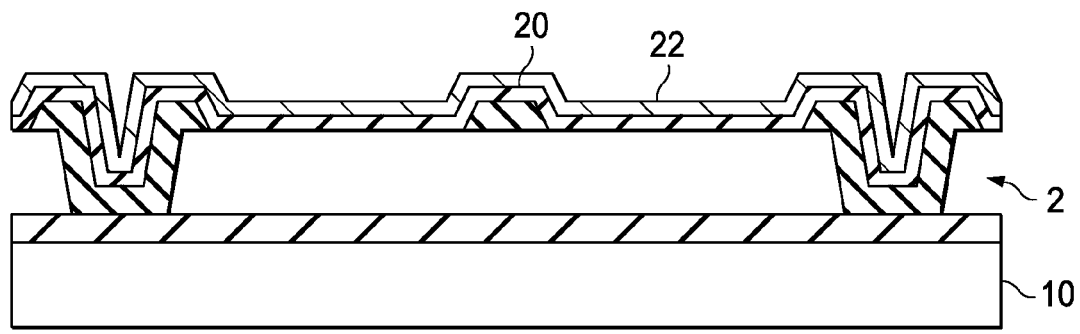
Figure 2:
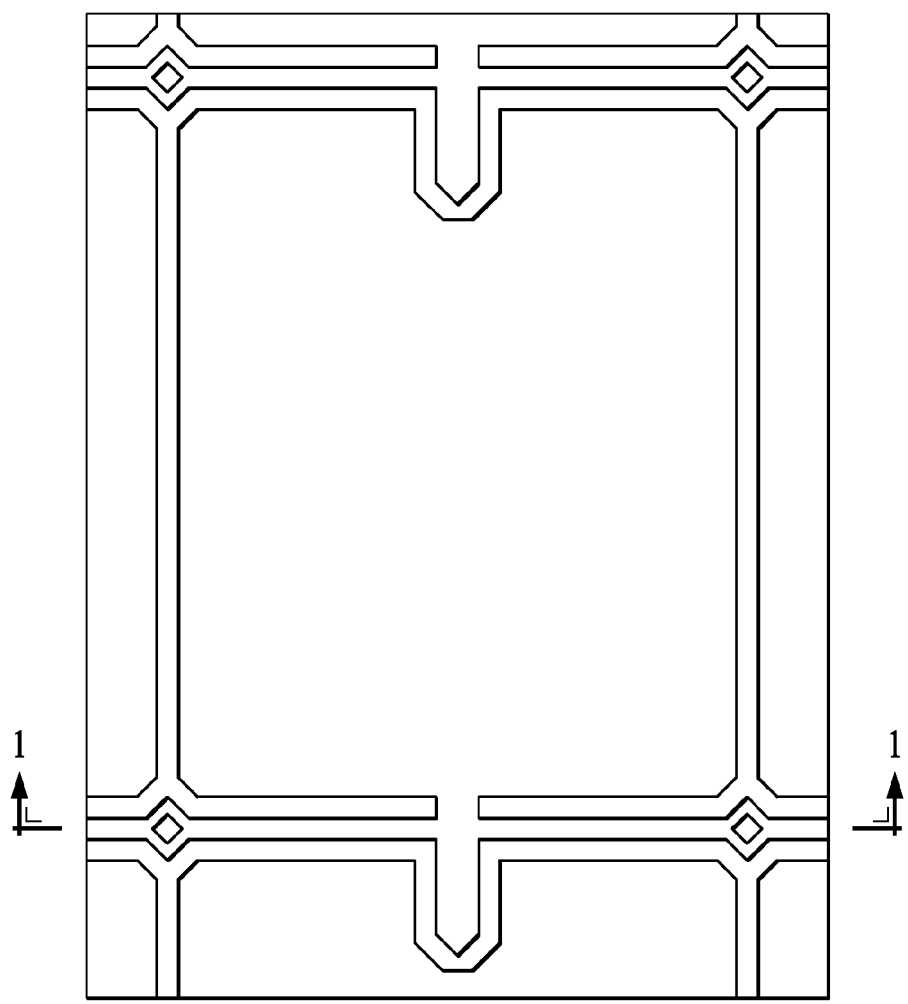
FIG. 2 is a top view of a micromirror showing line 1-1 for taking the cross section for FIGS. 1A to 1E.
Figure 3A:
FIGS. 3A to 3E are cross sectional views illustrating the same method as in FIGS. 1A to 1E but taken along a different cross section.
Figure 3B:
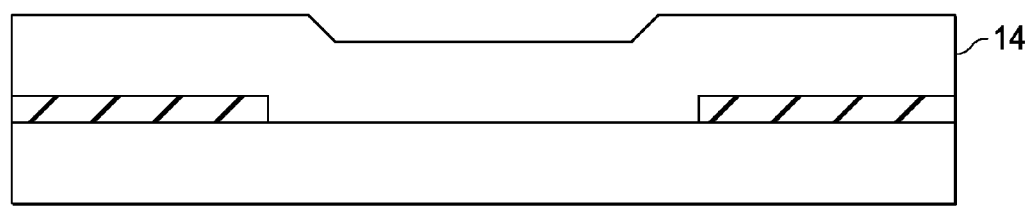
Figure 3C:
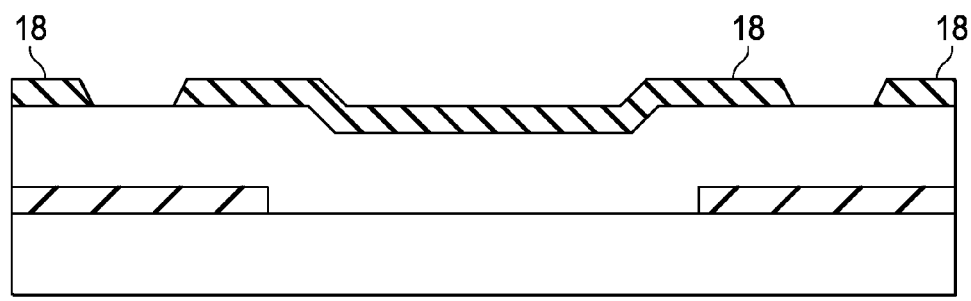
Figure 3D:
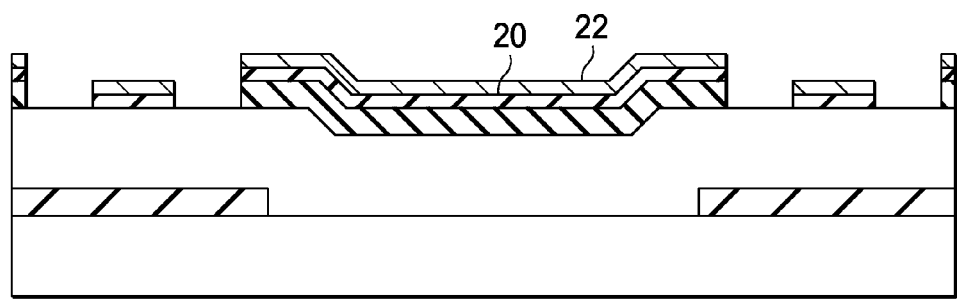
Figure 3E:
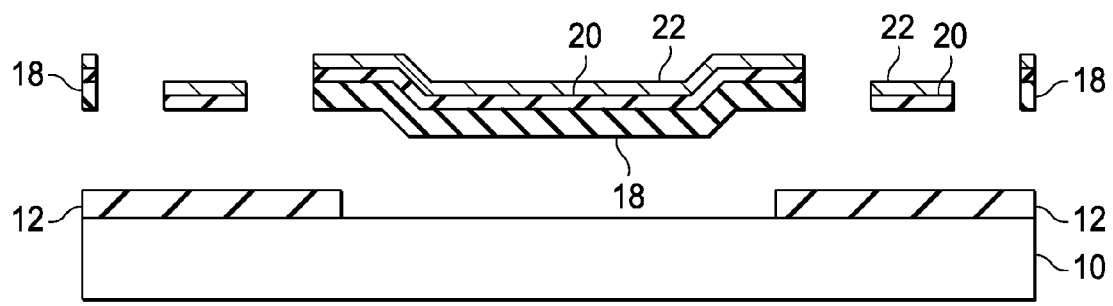
Figure 4:
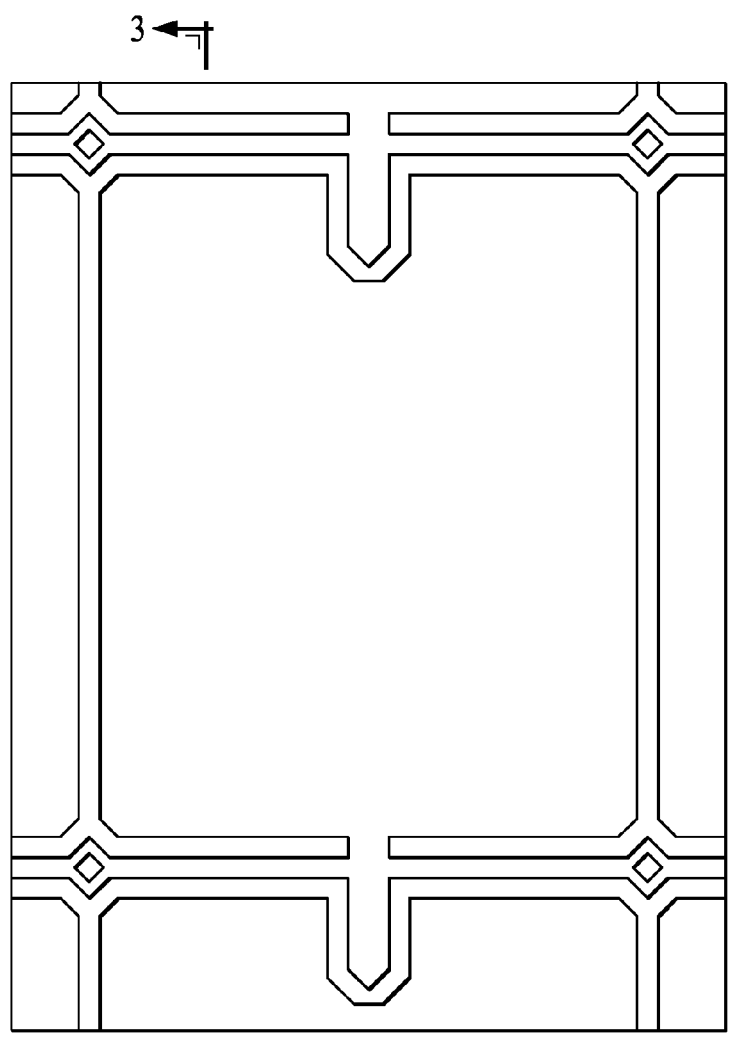
FIG. 4 is a top view of a mirror showing line 3-3 for taking the cross section for FIGS. 3A to 3E.

As also seen in FIG. 1D, a reflective and conductive layer 22 is deposited. The reflective/conductive material can be gold, aluminum or other metal, or an alloy of more than one metal though it is preferably aluminum deposited by PVD. The thickness of the metal layer can be from 50 to 2000 Å, preferably around 500 Å. It is also possible to deposit separate reflective and conductive layers. An optional metal passivation layer (not shown) can be added, e.g. a 10 to 1100 Å silicon oxide layer deposited by PECVD. Then, photoresist patterning on the metal layer is followed by etching through the metal layer with a suitable metal etchant. In the case of an aluminum layer, a chlorine (or bromine) chemistry can be used (e.g. a plasma/RIE etch with $Cl_2$ and/or $BCl_3$ (or Cl2, CC14, Br2, $CBr_4$, etc.) with an optional preferably inert diluent such as Ar and/or He). Then, the sacrificial layer is removed in order to "release" the MEMS structures (FIG. 1E).

In the embodiment illustrated in FIGS. 1A to 1E, both the first and second layers are deposited in the area defining the movable (mirror) element, whereas the second layer, in the absence of the first layer, is deposited in the area of the hinge. It is also possible to use more than two layers to produce a laminate movable element, which can be desirable particularly when the size of the movable element is increased such as for switching light beams in an optical switch. A plurality of layers could be provided in place of single layer 18 in FIG. 1C, and a plurality of layers could be provided in place of layer 20 and in place of layer 22. Or, layers 20 and 22 could be a single layer, e.g. a pure metal layer or a metal alloy layer or a layer that is a mixture of e.g. a dielectric or semiconductor and a metal. Some materials for such layer or layers that could comprise alloys of metals and dielectrics or compounds of metals and nitrogen, oxygen or carbon (particularly the transition metals) are disclosed in U.S. provisional patent application 60/228,007, the subject matter of which is incorporated herein by reference.

In one embodiment, the reinforcing layer is removed in the area of the hinge, followed by depositing the hinge layer and patterning both reinforcing and hinge layer together. This joint patterning of the reinforcing layer and hinge layer can be done with the same etchant (e.g. if the two layers are of the same material) or consecutively with different etchants. The reinforcing and hinge layers can be etched with a chlorine chemistry or a fluorine (or other halide) chemistry (e.g. a plasma/RIE etch with $F_2$, $CF_4$, $CHF_3$, $C_3F_8$, $CH_2F_2$, $C_2F_6$, $SF_6$, etc. or more likely combinations of the above or with additional gases, such as $CF_4/H_2$, $SF_6/Cl_2$, or gases using more than one etching species such as $CF_2Cl_2$, all possibly with one or more optional inert diluents). Of course, if different materials are used for the reinforcing layer and the hinge layer, then a different etchant can be employed for etching each layer. Alternatively, the reflective layer can be deposited before the first (reinforcing) and/or second (hinge) layer. Whether deposited prior to the hinge material or prior to both the hinge material and the reinforcing material, it is preferable that the metal be patterned (e.g. removed in the hinge area) prior to depositing and patterning the hinge material.

FIGS. 3A to 3E illustrate the same process taken along a different cross section (cross section 3-3 in FIG. 4) and show the optional block layer 12 deposited on the light transmissive substrate 10, followed by the sacrificial layer 14, layers 18, 20 and the metal layer 22. The cross sections in FIGS. 1A to 1E and 3A to 3E are taken along substantially square mirrors in FIGS. 2 and 4 respectively. However, the mirrors need not be square but can have other shapes that may decrease diffraction and increase the contrast ratio. Such mirrors are disclosed in U.S. provisional patent application 60/229,246 to Ilkov et al., the subject matter of which is incorporated herein by reference. Also, the mirror hinges can be torsion hinges as illustrated in this provisional application.

Figure 13:
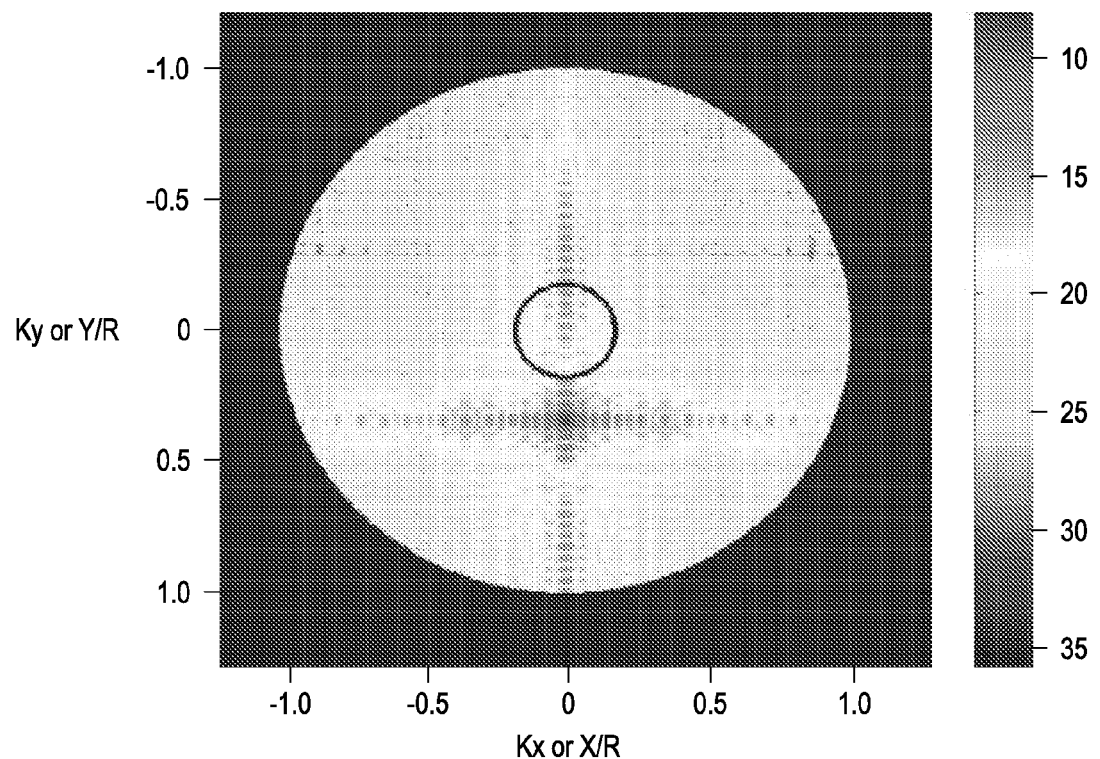
FIG. 13 to FIG. 15 present diffraction patterns of the micromirrors.
Figure 14:
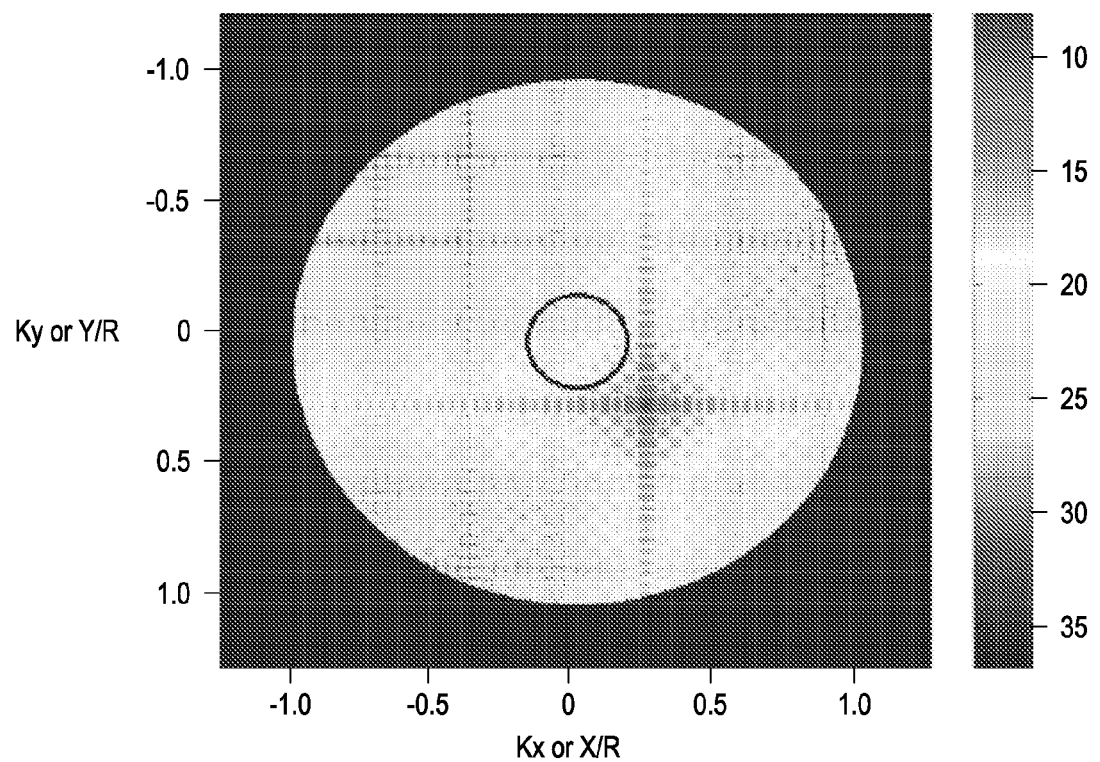

As can be seen in FIG. 13, a diffraction pattern in the shape of a "t" intersects the acceptance cone (the circle in the figure). The diffraction pattern can be seen in this figure as a series of dark dots (with a corresponding white background) that form one vertical and one horizontal line, and which connect just below the acceptance cone circle added onto the diffraction pattern. Therefore, as can be seen in this figure, the vertical diffraction line will enter the acceptance cone of the projection optics when the mirror is in the off-state, thus harming the contrast ratio. Likewise in FIG. 14, a series of four white diffraction lines (one vertical, one horizontal, and two diagonal) intersect below the acceptance cone of the system optics. As in FIG. 13, one of the diffraction lines intersects the acceptance cone such that diffracted light will be viewed when the mirror is in the off-state.

Figure 15:
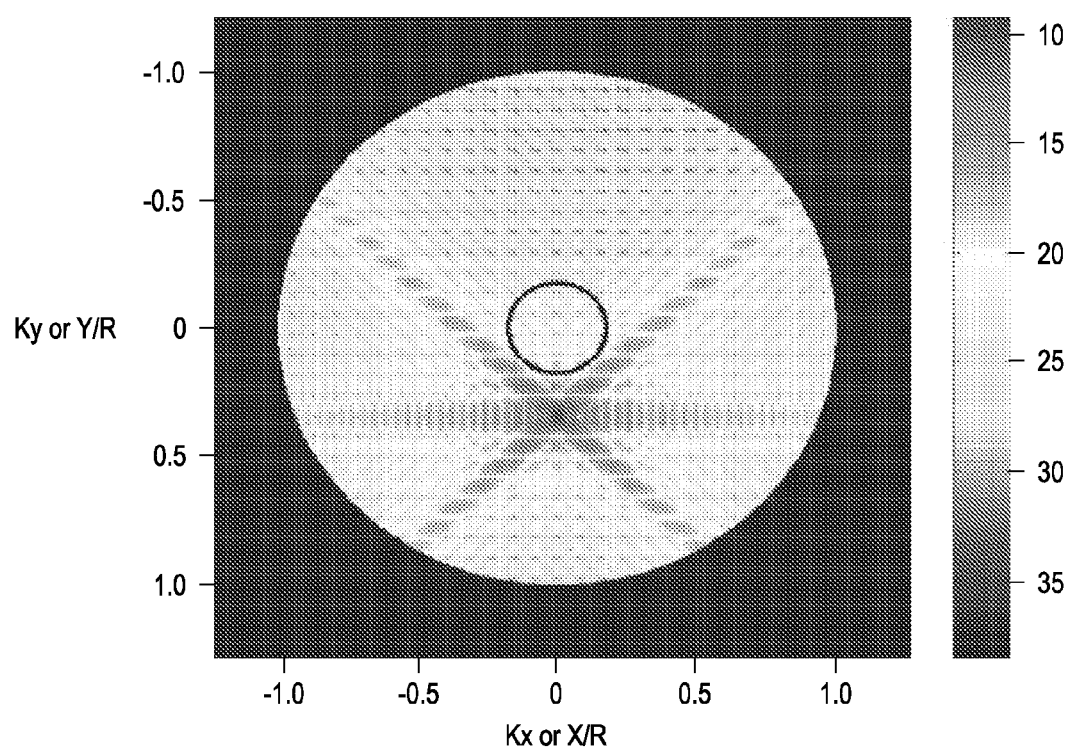

In contrast, as can be seen in FIG. 15, the diffraction pattern of the present invention (mirror in off-state) does not have a diffraction line extending though the optics acceptance cone, or otherwise to the spatial region where light is directed when the mirror is in the on-state. Thus substantially no diffracted or scattered light is passed to the area where light is passed when the mirror is in the on-state. Such a diffraction pattern, with light orthogonal to the edges of the active area of the array (and/or orthogonal to the columns or rows) is new. The arrangement of light source and incoming light beam to the array, and to each mirror, which allows for such improved contrast ratio, can be seen in FIGS. 16 and 17. As can be seen in FIG. 16, a light source 114 directs a beam of light 116 at a 90 degree angle to the leading edge 122 of the active area of the array (the active area of the array illustrated as rectangle 120 in the figure. The active area corresponds to the directly viewed or projected square or rectangular screen (not shown), which is the result of light reflecting off of particular mirrors in the array, and passing through optics 115 (simplified as two lenses for clarity). Mirrors in their off-state, direct light to area 99 in FIG. 16. Thus, whether the viewed image is on a computer, television or movie screen, the pixels on the screen image (each pixel on the viewed or projected image corresponding to a mirror element in the array) have edges which are not parallel to at least two of the four sides defining the rectangular or square screen image. As can be seen in one example of a mirror element in FIG. 17, the incoming light beam hits no perpendicular edges of the mirror element. The incoming light beam may be 20 degrees from normal (to the mirror/array plane), though regardless of the angle of the incoming light beam from normal, no mirror edges will be perpendicular.

Figure 17:
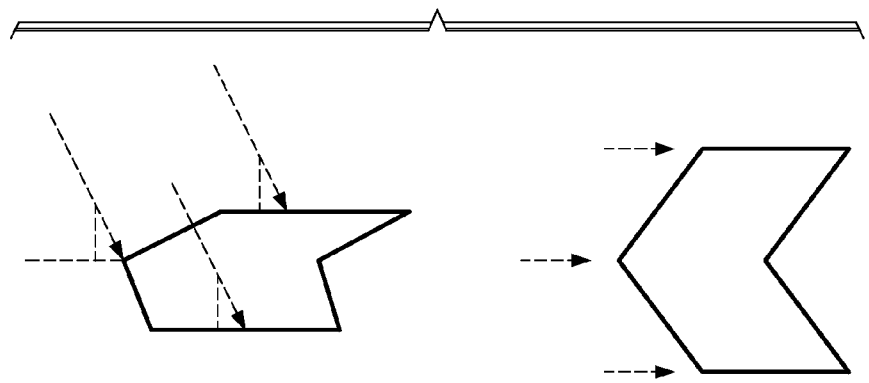
FIG. 17 schematically illustrates that the light has an incident angle to the edges of the mirror plates.

One example of a mirror element of the present invention is illustrated in FIG. 17. As can be seen in this figure, the incoming light beam does not impinge orthogonally onto any edge of the mirror element. In fact, in a preferred embodiment, the mirror edges should be disposed at a 55 degree angle or less in relation to the incoming light beam, preferably 45 degrees or less, and most preferably 40 degrees or less. Though the mirror edges are not perpendicular to the incoming light beam, the switching axis of each mirror is perpendicular to the incoming light beam (and thus perpendicular to two of the four active area (or screen image) edges).

Figure 18:
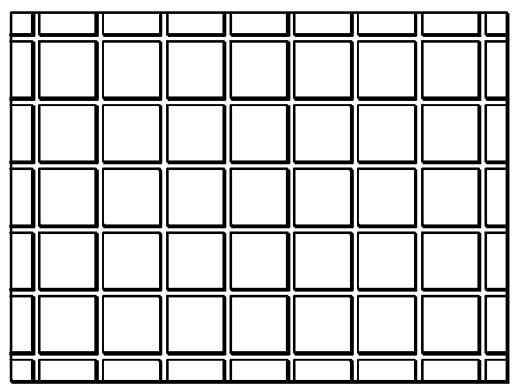
FIG. 18 to FIG. 29 schematically illustrates top views of exemplary arrays of micromirrors of the invention.
Figure 19:
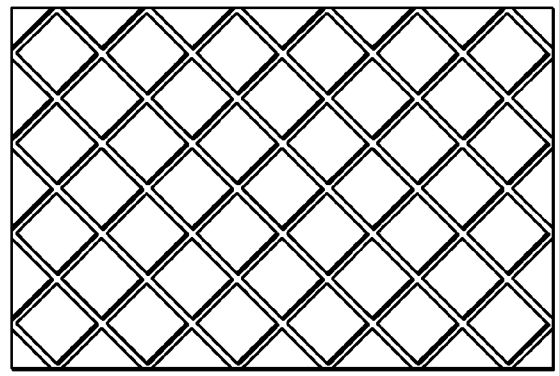
Figure 20:
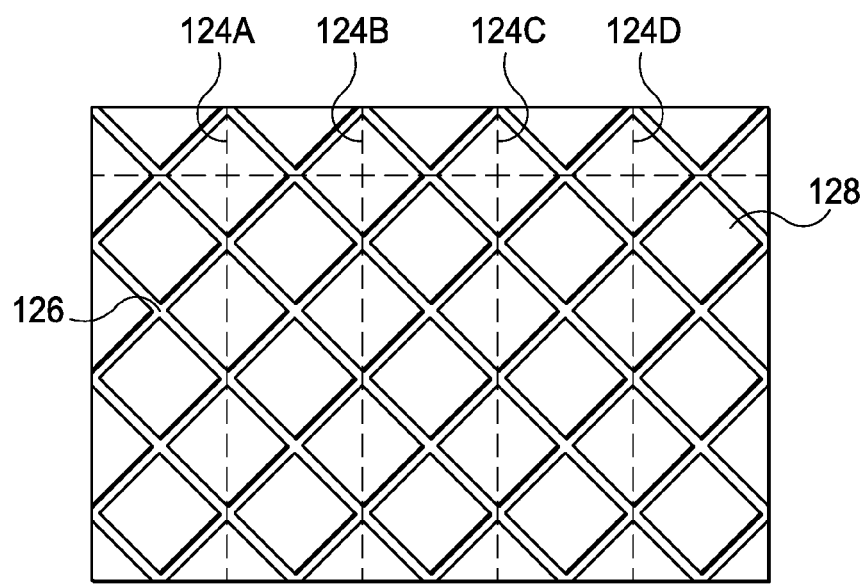

FIG. 18 is an illustration of an array (of course with many fewer pixels than within the typical active area). As can be seen in this figure, the edges of each pixel are parallel to corresponding edges of the active area. Thus, each mirror edge is either perpendicular or horizontal to the edges of the active area. In contrast, in the present invention such as illustrated in FIG. 19, the mirror edges are neither parallel nor perpendicular to the active area edges. As will be seen below, in other embodiments, some of the edges are neither parallel nor perpendicular to active area edges, and some edges can be parallel to active area edges (as long as also parallel to the direction of the incoming light beam). Though the mirror array as illustrated in FIG. 19 achieves lower light scatter/diffraction in the mirror off-state, such an arrangement can increase the complexity of the addressing scheme. Horizontal line 128 connects the top row of mirror elements, and vertical lines 124A-124D extend from each of these top row mirrors (these horizontal and vertical lines corresponding to addressing rows and columns in the array). As can be seen in FIG. 20, only every other mirror is connected in this way. Thus, in order for all mirrors to be addressed, twice as many rows and columns are needed, thus resulting in added complexity in addressing the array. FIG. 20 also shows support posts 126 at the corners of the mirrors, which support posts connect to hinges (not shown) below each mirror element and to an optically transmissive substrate (not shown) above the mirror elements (see the '840 patent for further details).

Figure 21:
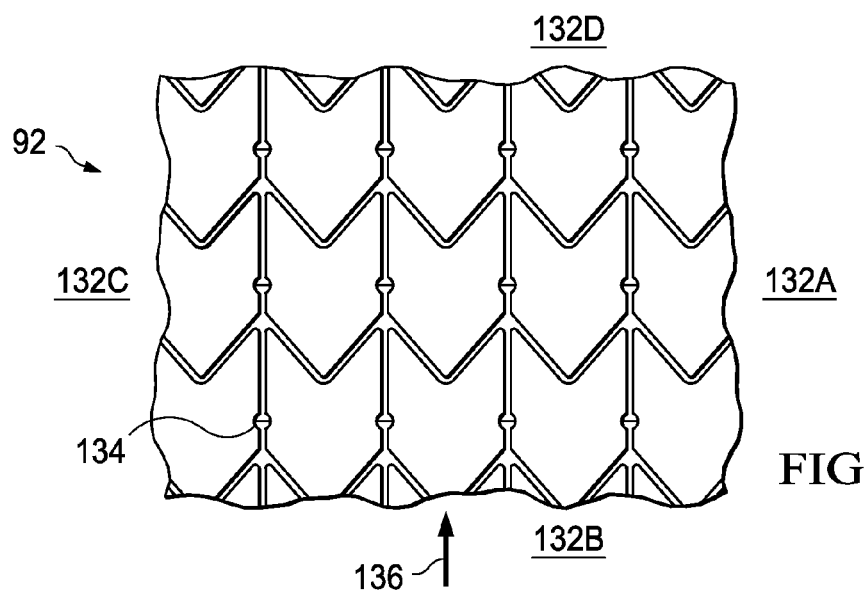

In a more preferred embodiment of the invention as shown in FIG. 21, an array 130, having active area edges 132A-132D, is provided. A light beam 136 is directed at the array such that no mirror edges are perpendicular to the direction of the incoming light beam. In FIG. 21, the leading edges of the mirrors (relative to incoming light beam 136) are at a 45 degree angle to light beam 136. It is preferred that the angle of the leading edge(s) of the mirror be more than 40 degrees from a mirror edge that would be perpendicular to the incoming light beam. The contrast ratio is further improved if the angle of the leading edge is 45 degrees or more, and can even be 50 degrees or more. As can be seen in FIG. 21, the mirror elements are densely packed ("interlocking") and do not result in addressing issues as discussed above. Posts 134 connect to hinges (not shown) below each mirror element in FIG. 21. The hinges extend perpendicularly to the direction of the incoming light beam (and parallel to the leading and trailing edges 132A and 132D of the active areas). The hinges allow for an axis of rotation of the mirrors which is perpendicular to the incoming light beam.

Figure 22:
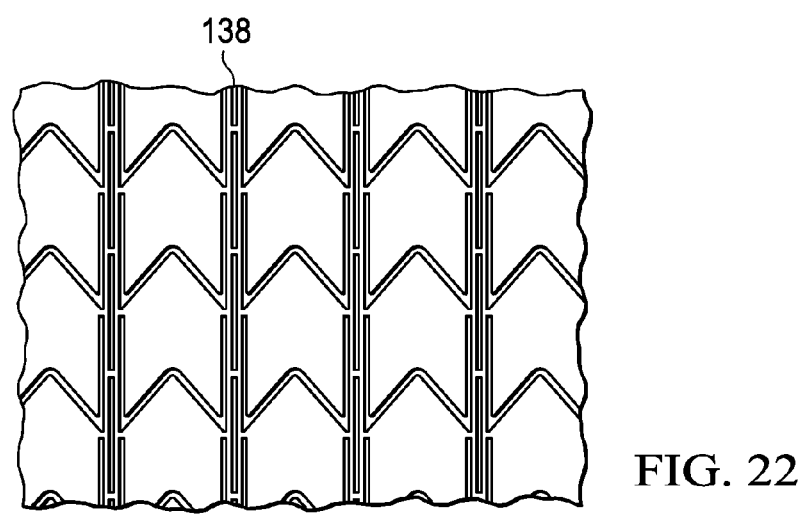
Figure 23:
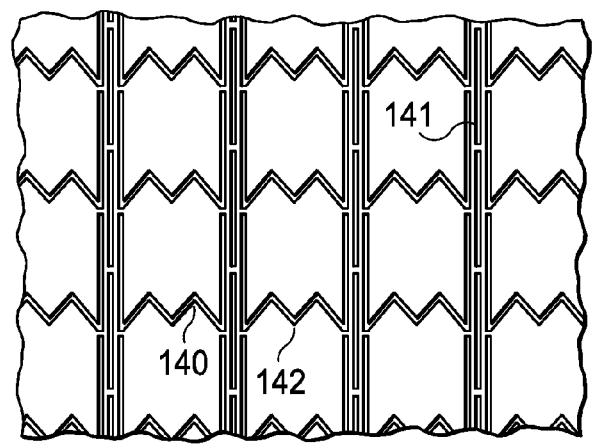
Figure 24:
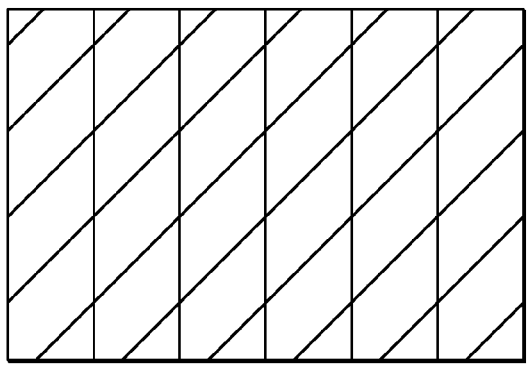
Figure 25:
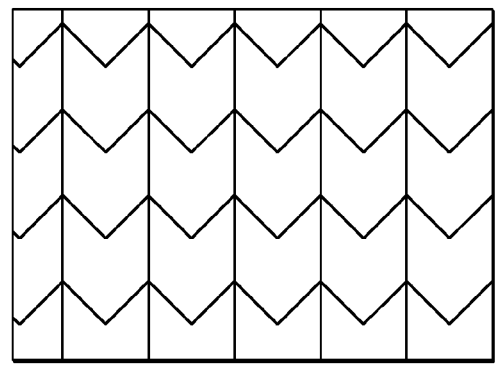
Figure 26:
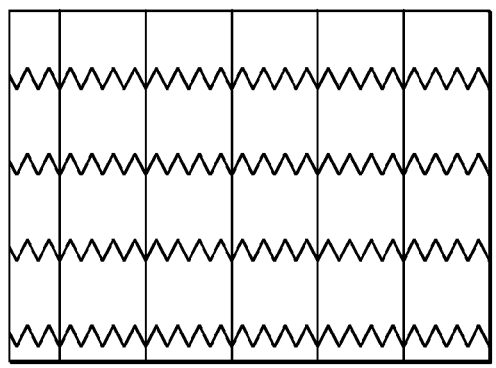
Figure 27:
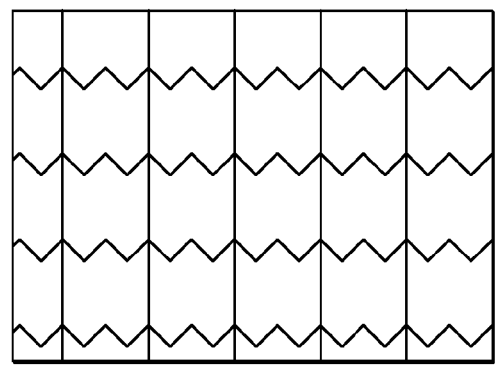
Figure 28:
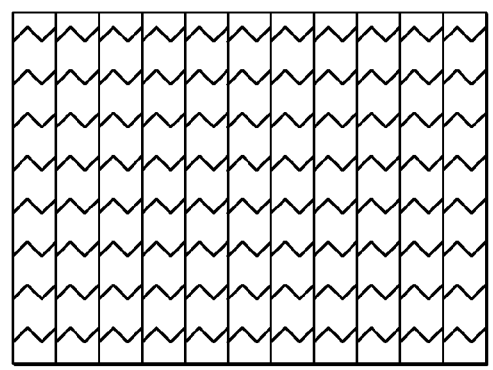
Figure 29:
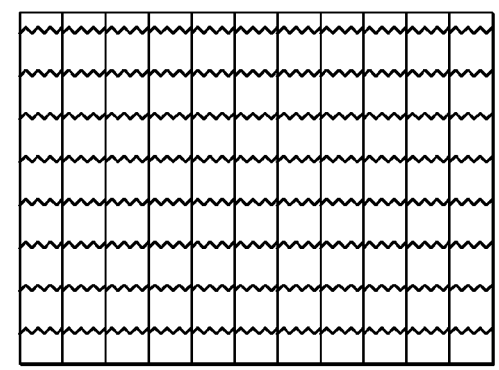

FIG. 22 is an illustration of mirrors similar to that shown in FIG. 21. In FIG. 22, however, the mirror elements are "reversed" and have their "concave" portion as their leading edge. Even though the mirrors in FIG. 22 are reversed from that shown in FIG. 21, there are still no edges of the mirrors which are perpendicular to the incoming light beam. FIG. 22 illustrates a hinge 138 disposed in the same plane as the mirror element to which the hinge is attached. Both types of hinges are disclosed in the '840 patent mentioned above. FIG. 23 likewise illustrates a hinge 144 in the same plane as the mirror array, and shows both "concave" portions 140 and "convex" portions 142 on the leading edge of each mirror.

FIGS. 23 to 29 illustrate further embodiments of the invention. Though the shapes of the mirrors are different in each figures each is the same in the sense that none has any edges perpendicular to the incoming light beam. Of course, when a mirror edge changes direction, there is as point, however small, where the edge could be considered perpendicular, if only instantaneously. However, when it is stated that there are no edges perpendicular, it is meant that there are no substantial portions which are perpendicular, or at least no such portions on the leading edge of the mirrors. Even if the direction of the leading edges changed gradually, it is preferred that there would never be more than ½ of the leading edge that is perpendicular to the incoming light beam, more preferably no more than ¼, and most preferably ¹⁄₁₀ or less. The lower the portion of the leading edge that is perpendicular, the greater the improvement in contrast ratio.

Figure 30A:
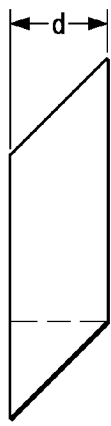
FIG. 30A to FIG. 30F schematically illustrate arrangement of the micromirrors in a micromirror array.
Figure 30D:
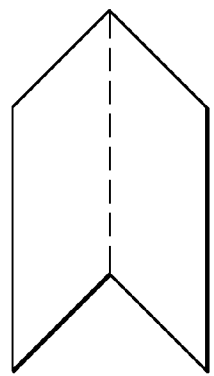
Figure 30B:
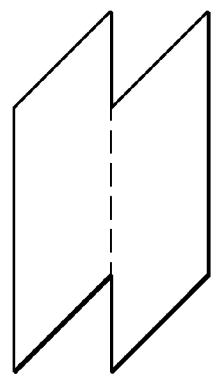
Figure 30E:
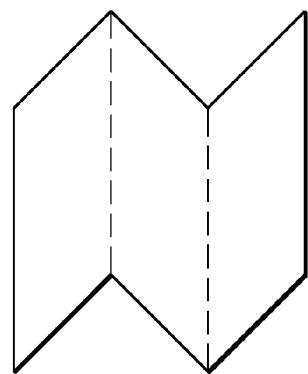
Figure 30C:
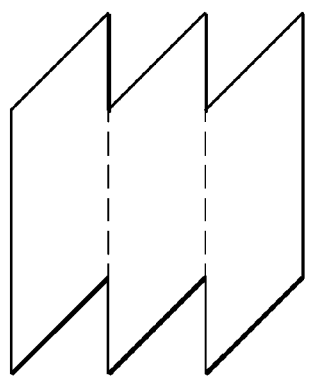
Figure 30F:
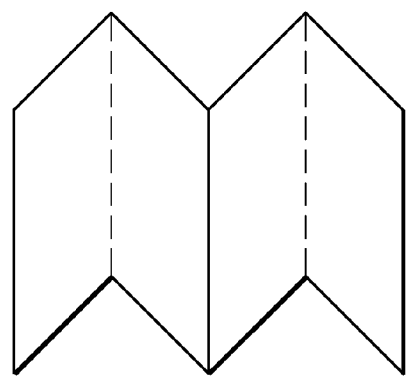

Many of the mirror embodiments can be viewed as one or more parallelograms connected together. As can be seen in FIG. 30a, a single parallelogram is effective for decreasing light scatter (or diffraction) as it has not edges perpendicular to the incoming light beam (assuming that the light beam has a direction from the bottom to the top of the page of FIG. 30a (and starting from out of the plane of the page). FIG. 30a illustrates a single parallelogram with width d. FIGS. 30b and 30c show both two and three parallelogram mirror designs, where each subsequent parallelogram has the same shape, size and appearance as the one before. This arrangement forms a saw-tooth leading and trailing edge of the mirror element. FIGS. 30d to 30f illustrate from 2 to 4 parallelograms. However, in FIGS. 30d to 30f, each subsequent parallelogram is a mirror image of the one before, rather than the same image. This arrangement forms a jagged edge on the leading and trailing edges of the mirror elements. Though the trailing edge need not be "jagged" or "saw-tooth" (it could, in fact, be perpendicular to the incoming light beam, however this would result in a lower fill factor for the array).

It should be noted that the parallelograms need not each be of the same width, and a line connecting the tips of the saw-tooth or jagged edges need not be perpendicular to the incoming light beam. The width of each parallelogram if they are constructed to be of the same width, will be d=M/N, where M is total mirror width, N is the number of parallelograms. With an increasing number of parallelograms, the width d is decreasing (assuming constant mirror width). However, width d should be much larger than the wavelength of the incident light. In order to keep the contrast ratio high, the number of parallelograms N (or the number of times the leading mirror edge changes direction) should be less than or equal to 0.5 M/$\lambda$, or preferably less than or equal to 0.2 M/$\lambda$, and even less than or equal to 0.1 M/$\lambda$, where $\lambda$ is the wavelength of the incident light. Though the number of parallelograms are anywhere from 1 to 4 in FIG. 30a to FIG. 30f, any number are possible, though 15 or fewer, and preferably 10 or fewer result in better contrast ratio. The number in FIG. 30a to FIG. 30f is most preferred (4 or fewer).

Figure 31:
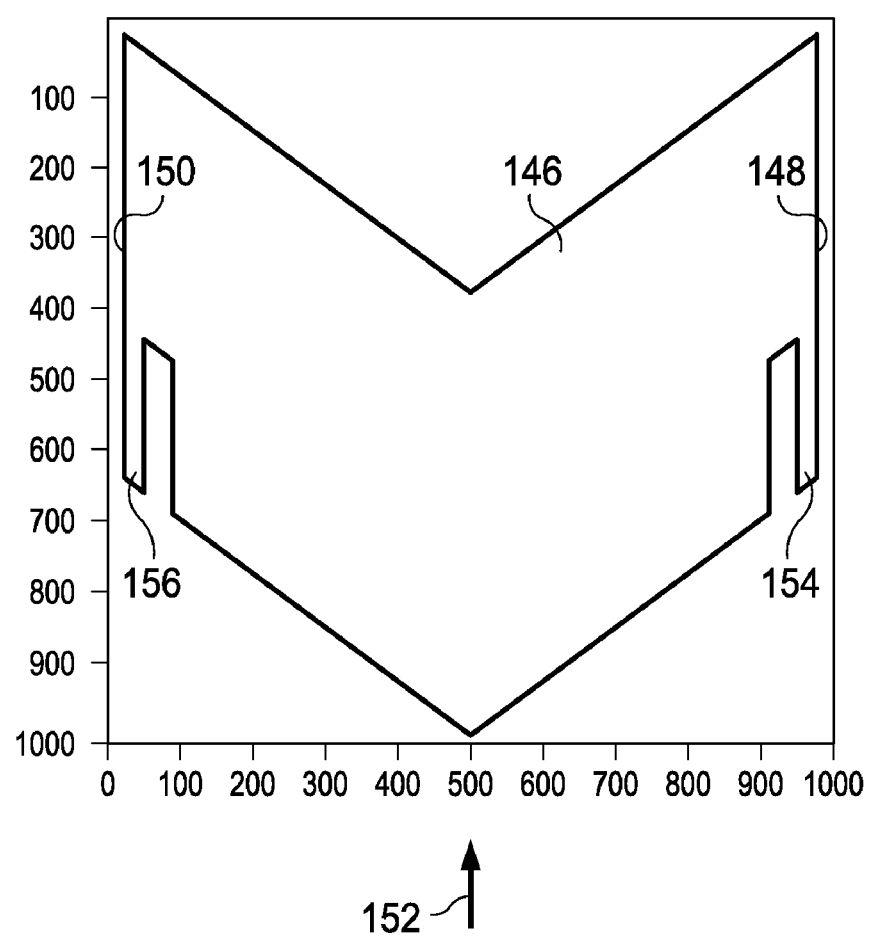
FIG. 31 shows an exemplary mirror plate of the invention.

As can be seen in FIG. 31, hinges (or flexures) 154, 156 are disposed in the same plane as mirror element 146. Incident light beam 152 from a light source out of the plane of FIG. 31, impinges on leading edges of mirror 146, none of which are perpendicular. It is preferred that no portion of the hinges be perpendicular to the incoming light beam, so as to decrease light scatter.

It should also be noted that materials and method mentioned above are examples only, as many other method and materials could be used. For example, the Sandia SUMMiT process (using polysilicon for structural layers) or the Cronos MUMPS process (also polysilicon for structural layers) could be used in the present invention. Also, a MOSIS process (AMI ABN—1.5 um CMOS process) could be adapted for the present invention, as could a MUSiC process (using polycrystalline SiC for the structural layers) as disclosed, for example, in Mehregany et al., Thin Solid Films, v. 355-356, pp. 518-524, 1999. Also, the sacrificial layer and etchant disclosed herein are exemplary only. For example, a silicon dioxide sacrificial layer could be used and removed with HF (or HF/HCl), or a silicon sacrificial could be removed with ClF3 or BrF3. Also a PSG sacrificial layer could be removed with buffered HF, or an organic sacrificial such as polyimide could be removed in a dry plasma oxygen release step. Of course the etchant and sacrificial material should be selected depending upon the structural material to be used. Also, though PVD and CVD are referred to above, other thin film deposition methods could be used for depositing the layers, including spin-on, sputtering, anodization, oxidation, electroplating and evaporation.

After forming the microstructures as in FIGS. 1 to 4 on the first wafer, it is preferably to remove the sacrificial layer so as to release the microstructures (in this case micromirrors). This release can be performed at the die level, though it is preferred to perform the release at the wafer level. FIGS. 1E and 3E show the microstructures in their released state. As can be seen in FIG. 1E, posts 2 hold the released microstructure on substrate 10.

Also, though the hinge of each mirror can be formed in the same plane as the mirror element (and/or formed as part of the same deposition step) as set forth above, they can also be formed separated from and parallel to the mirror element in a different plane and as part of a separate processing step. This superimposed type of hinge is disclosed in FIGS. 11 and 12 of the previously-mentioned U.S. Pat. No. 6,046,840, and in more detail in U.S. patent application "A Deflectable Spatial Light Modulator Having Superimposed Hinge and Deflectable Element" to Huibers et al. filed Aug. 3, 2000, the subject matter of which being incorporated herein. Whether formed with one sacrificial layer as in the Figures, or two (or more) sacrificial layers as for the superimposed hinge, such sacrificial layers are removed as will be discussed below, with a preferably isotropic etchant. This "release" of the mirrors can be performed immediately following the above described steps, or after shipment from the foundry at the place of assembly.

Backplane:

The second or "lower" substrate (the backplane) die contains a large array of electrodes on a top metal layer of the die. Each electrode electrostatically controls one pixel (one micromirror on the upper optically transmissive substrate) of the microdisplay. The voltage on each electrode on the surface of the backplane determines whether its corresponding microdisplay pixel is optically 'on' or 'off,' forming a visible image on the microdisplay. Details of the backplane and methods for producing a pulse-width-modulated grayscale or color image are disclosed in U.S. patent application Ser. No. 09/564,069 to Richards, now U.S. Pat. No. 6,388,661, the subject matter of which is incorporated herein by reference.

The display pixels themselves, in a preferred embodiment, are binary, always either fully 'on' or fully 'off,' and so the backplane design is purely digital. Though the micromirrors could be operated in analog mode, no analog capability is necessary. For ease of system design, the backplane's I/O and control logic preferably run at a voltage compatible with standard logic levels, e.g. 5V or 3.3V. To maximize the voltage available to drive the pixels, the backplane's array circuitry may run from a separate supply, preferably at a higher voltage.

One embodiment of the backplane can be fabricated in a foundry 5V logic process. The mirror electrodes can run at 0-5V or as high above 5V as reliability allows. The backplane could also be fabricated in a higher-voltage process such as a foundry Flash memory process using that process's high-voltage devices. The backplane could also be constructed in a high-voltage process with larger-geometry transistors capable of operating at 12V or more. A higher voltage backplane can produce an electrode voltage swing significantly higher than the 5-7V that the lower voltage backplane provides, and thus actuate the pixels more robustly.

In digital mode, it is possible to set each electrode to either state (on/off), and have that state persist until the state of the electrode is written again. A RAM-like structure, with one bit per pixel is one architecture that accomplishes this. One example is an SRAM-based pixel cell. Alternate well-known storage elements such as latches or DRAM (pass transistor plus capacitor) are also possible. If a dynamic storage element (e.g. a DRAM-like cell) is used, it is desirable that it be shielded from incident light that might otherwise cause leakage.

The perception of a grayscale or full-color image will be produced by modulating pixels rapidly on and off, for example according to the method in the above-mentioned U.S. patent application Ser. No. 09/564,069 to Richards. In order to support this, it is preferable that the backplane allows the array to be written in random-access fashion, though finer granularity than a row-at-a-time is generally not necessary.

it is desirable to minimize power consumption, primarily for thermal reasons. Decreasing electrical power dissipation will increase the optical/thermal power budget, allowing the microdisplay to tolerate the heat of more powerful lamps. Also, depending upon the way the microdisplay is assembled (wafer-to-wafer join+offset saw), it may be preferable for all I/O pads to be on one side of the die. To minimize the cost of the finished device it is desirable to minimize pin count. For example, multiplexing row address or other infrequently-used control signals onto the data bus can eliminate separate pins for these functions with a negligible throughput penalty (a few percent, e.g. one clock cycle for address information per row of data is acceptable). A data bus, a clock, and a small number of control signals (5 or less) are all that is necessary.

In use, the die can be illuminated with a 200 W or more arc lamp. The thermal and photo-carrier effects of this may result in special layout efforts to make the metal layers as 'opaque' as possible over the active circuitry to reflect incident optical energy and minimize photocarrier and thermal effects. An on-chip PN diode could be included for measuring the temperature of the die.

In one embodiment the resolution is XGA, 1024×768 pixels, though other resolutions are possible. A pixel pitch of from 5 to 24 um is preferred (e.g. 14 um). The size of the electrode array itself is determined by the pixel pitch and resolution. A 14 um XGA device's pixel array will therefore be 14.336×10.752 mm.

Figure 5:
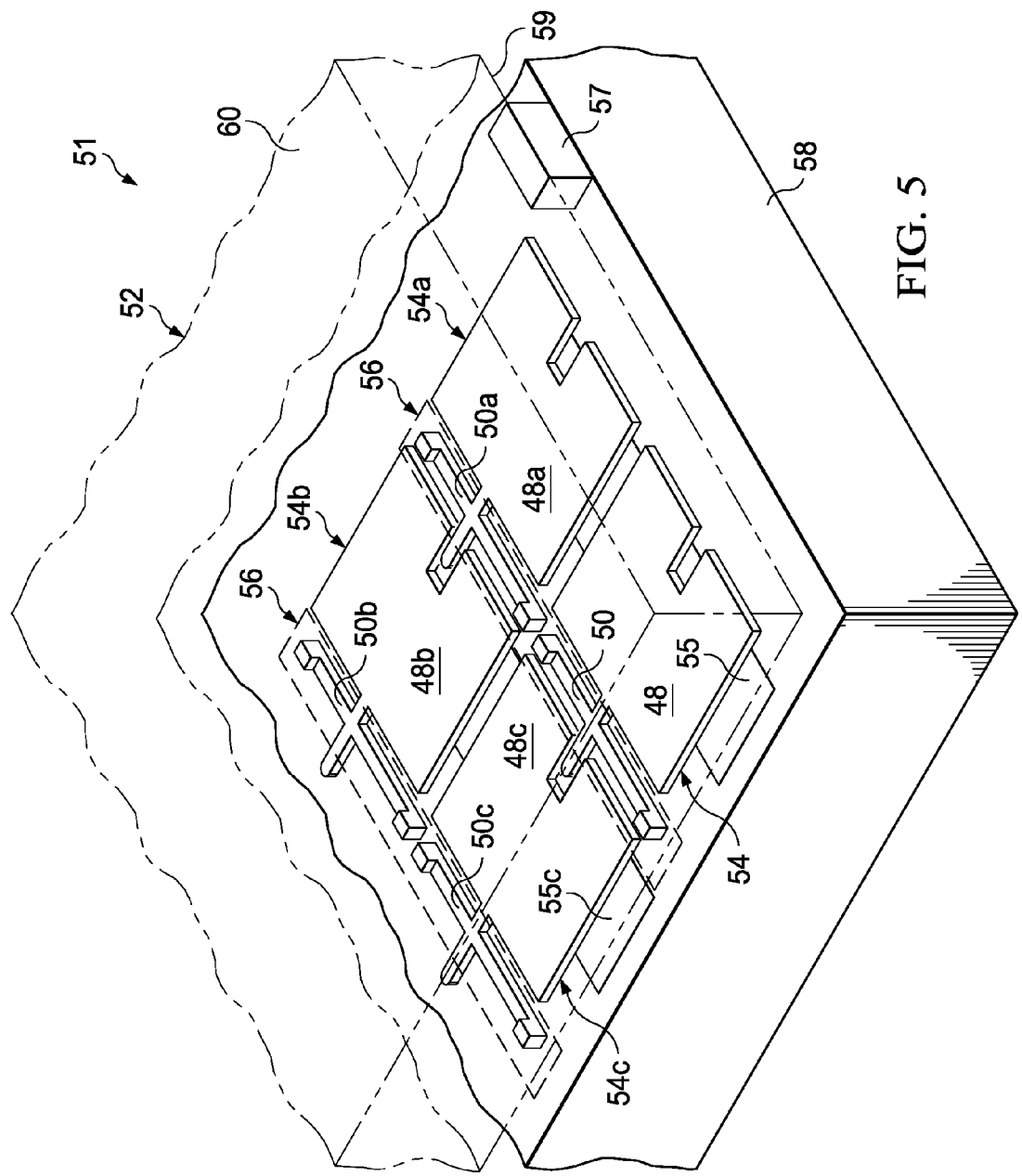
FIG. 5 is an isometric view of the assembly of two substrates, one with micromirrors, the other with circuitry and electrodes.
Figure 6:
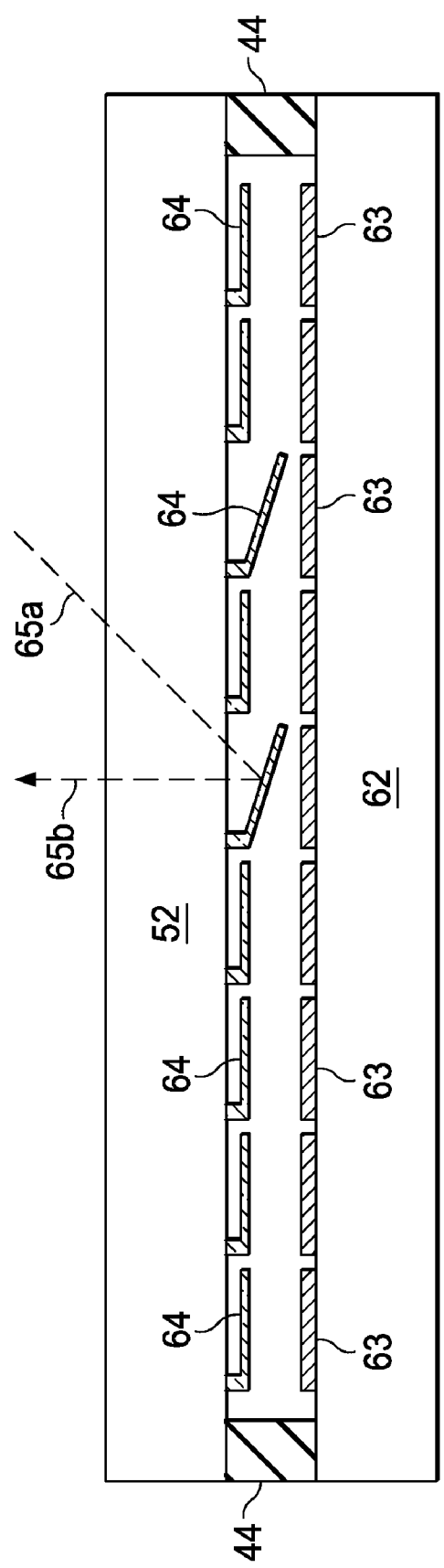
FIG. 6 is a cross sectional view of the assembled device in use.

Assembly:

After the upper and lower substrates (wafers) are finished being processed (e.g. circuitry/electrodes on lower wafer, micromirrors on upper wafer), the upper and lower wafers are joined together. This joining of the two substrates allows micromirrors on one substrate to be positioned proximate to electrodes on the other substrate. This arrangement is illustrated in FIGS. 5 and 6, which figures will be described further below.

Figure 7:
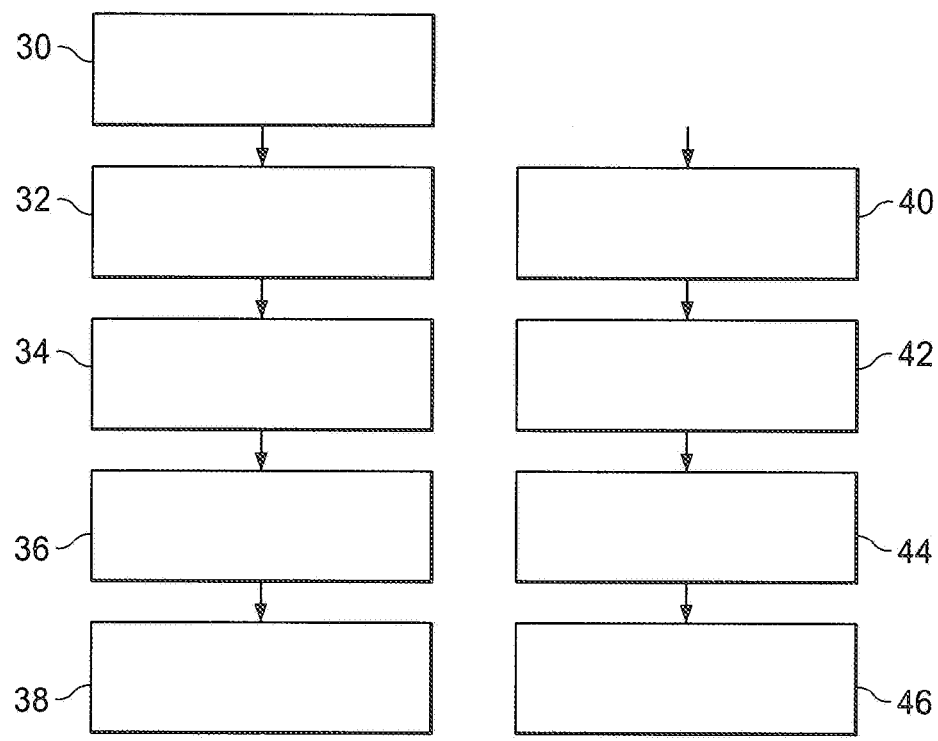
FIG. 7 is a flow chart of one method of the invention.

The method for the assembly of the wafers and separation of the wafer assembly into individual dies and is similar in some ways to the method for assembly of a liquid crystal device as disclosed in U.S. Pat. No. 5,963,289 to Stefanov et al, "Asymmetrical Scribe and Separation Method of Manufacturing Liquid Crystal Devices on Silicon Wafers", which is hereby incorporated by reference. Many bonding methods are possible such as adhesive bonding (e.g. epoxy, silicone, low K material or other adhesive—described further herein), anodic bonding, compression bonding (e.g. with gold or indium) metal eutectic bonding, solder bonding, fusion bonding, or other wafer bonding processes known in the art. Whether the upper and lower wafer are made of the same or different materials (silicon, glass, dielectric, multilayer wafer, etc.), they can first be inspected (step 30 in the flow chart of FIG. 7) for visual defects, scratches, particles, etc. After inspection, the wafers can be processed through industry standard cleaning processes (step 32). These include scrubbing, brushing or ultrasonic cleaning in a solvent, surfactant solution, and/or de-ionized (DI) water.

The mirrors are preferably released at this point (step 34). Releasing immediately prior to the application of epoxy or bonding is preferable (except for an optional stiction treatment between release and bonding). For silicon sacrificial layers, the release can be in an atmosphere of xenon difluoride and an optional diluent (e.g. nitrogen and/or helium). Of course, other etchants could be used, including interhalogens such as bromine trifluoride and bromine trichloride. The release is preferably a spontaneous chemical etch which does not require plasma or other external energy to etch the silicon sacrificial layer(s). After etching, the remainder of the device is treated for stiction (step 36) by applying an anti-stiction layer (e.g. a self assembled monolayer). The layer is preferably formed by placing the device in a liquid or gas silane, preferably a halosilane, and most preferably a chlorosilane. Of course, many different silanes are known in the art for their ability to provide anti-stiction for MEMS structures, including the various trichlorsilanes set forth in "Self Assembled Monolayers as Anti-Stiction Coatings for MEMS: Characteristics and Recent Developments", Maboudian et al., as well as other unfluorinated (or partially or fully fluorinated) alkyl trichlorosilanes, preferably those with a carbon chain of at least 10 carbons, and preferably partially or fully fluorinated. (Tridecafluoro-1,1,2,2-tetrahydro-octyl)trichlorosilane available from Gelest, Inc. is one example. Other trichlorosilanes (preferably fluorinated) such as those with phenyl or other organic groups having a ring structure are also possible. Various vapor phase lubricants for use in the present invention are set forth in U.S. Pat. Nos. 6,004,912, 6,251,842, and 5,822,170, each incorporated herein by reference.

In order to bond the two wafers together, spacers are mixed into sealant material (step 38). Spacers in the form of spheres or rods are typically dispensed and dispersed between the wafers to provide cell gap control and uniformity and space for mirror deflection. Spacers can be dispensed in the gasket area of the display and therefore mixed into the gasket seal material prior to seal dispensing. This is achieved through normal agitated mixing processes. The final target for the gap between the upper and lower wafers is preferably from 1 to 10 um, though other gaps are possible depending upon the MEMS device being formed. This of course depends upon the type of MEMS structure being encapsulated and whether it was surface or bulk micromachined. The spheres or rods can be made of glass or plastic, preferably an elastically deforming material. Alternatively, spacer pillars can be fabricated on at least one of the substrates. In one embodiment, pillars/spacers are provided only at the side of the array. In another embodiment, pillars/spacers can be fabricated in the array itself. Other bonding agents with or without spacers could be used, including anodic bonding or metal compression bonding with a patterned eutectic or metal.

A gasket seal material can then be dispensed (step 40) on the bottom substrate in a desired pattern, usually in one of two industry standard methods including automated controlled liquid dispensing through a syringe and printing (screen, offset, or roller). When using a syringe, it is moved along X-Y coordinates relative to the parts. The syringe tip is constrained to be just above the part with the gasket material forced through the needle by positive pressure. Positive pressure is provided either by a mechanical plunger forced by a gear driven configuration and/or by an air piston and/or pressed through the use of an auger. This dispensing method provides the highest resolution and process control but provides less throughput.

Then, the two wafers are aligned (step 42). Alignment of the opposing electrodes or active viewing areas requires registration of substrate fiducials on opposite substrates. This task is usually accomplished with the aid of video cameras with lens magnification. The machines range in complexity from manual to fully automated with pattern recognition capability. Whatever the level of sophistication, they accomplish the following process: 1. Dispense a very small amount of a UV curable adhesive at locations near the perimeter and off of all functional devices in the array; 2. Align the fiducials of the opposing substrates within the equipment capability; and 3. Press substrates and UV tack for fixing the wafer to wafer alignment through the remaining bonding process (e.g., curing of the internal epoxy).

The final cell gap can be set by pressing (step 44) the previously tacked laminates in a UV or thermal press. In a UV press, a common procedure would have the substrates loaded into a press where at least one or both of the press platens are quartz, in order to allow UV radiation from a UV lamp to pass unabated to the gasket seal epoxy. Exposure time and flux rates are process parameters determined by the equipment and adhesive materials. Thermally cured epoxies require that the top and bottom platens of a thermal press be heated. The force that can be generated between the press platens is typically many pounds. With thermally cured epoxies, after the initial press the arrays are typically transferred to a stacked press fixture where they can continue to be pressed and post-cured for 4-8 hours.

Once the wafers have been bonded together to form a wafer assembly, the assembly can be separated into individual dies (step 46). Silicon substrate and glass scribes are placed on the respective substrates in an offset relationship at least along one direction. The units are then separated, resulting in each unit having a bond pad ledge on one side and a glass electrical contact ledge on an opposite side. The parts may be separated from the array by any of the following methods. The order in which the array (glass first) substrate is scribed is important when conventional solid state cameras are used for viewing and alignment in a scribe machine. This constraint exists unless special infrared viewing cameras are installed which make the silicon transparent and therefore permits viewing of front surface metal fiducials. The scribe tool is aligned with the scribe fiducials and processed. The resultant scribe lines in the glass are used as reference marks to align the silicon substrate scribe lanes. These scribe lanes may be coincident with the glass substrate scribes or uniformly offset. The parts are then separated from the array by venting the scribes on both substrates. Automatic breaking is done by commercially available guillotine or fulcrum breaking machines. The parts can also be separated by hand.

Separation may also by done by glass scribing and partial sawing of the silicon substrate. Sawing requires an additional step at gasket dispense. Sawing is done in the presence of a high-pressure jet of water. Moisture must not be allowed in the area of the fill port or damage of the MEMS structures could occur. Therefore, at gasket dispense, an additional gasket bead must be dispensed around the perimeter of the wafer. The end of each scribe/saw lane must be initially left open, to let air vent during the align and press processes. After the array has been pressed and the gasket material cured, the vents are then closed using either the gasket or end-seal material. The glass is then aligned and scribed as described above. Sawing of the wafer is done from the backside of the silicon where the saw streets are aligned relative to the glass scribe lanes described above. The wafer is then sawed to a depth of 50%-90% of its thickness. The parts are then separated as described above.

Alternatively, both the glass and silicon substrates may be partially sawed prior to part separation. With the same gasket seal configuration, vent and seal processes as described above, saw lanes are aligned to fiducials on the glass substrates. The glass is sawed to a depth between 50% and 95% of its thickness. The silicon substrate is sawed and the parts separated as described above.

Figure 8:
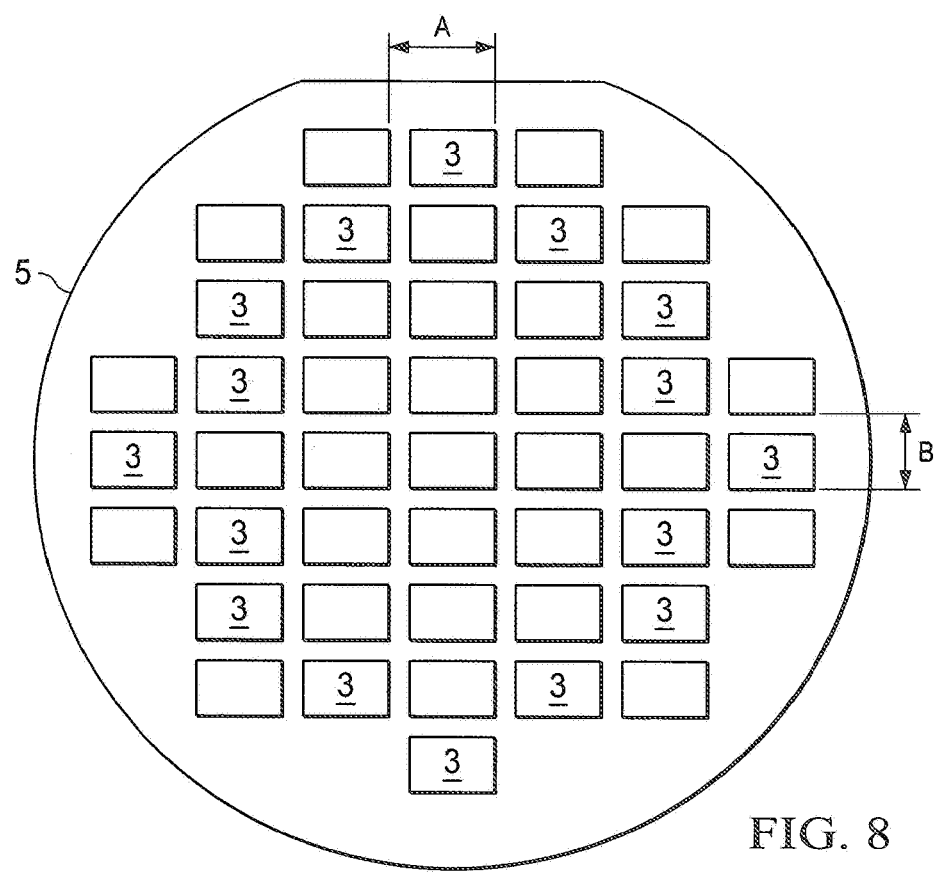
FIG. 8 is a top view of a wafer substrate having multiple die areas.

For an illustrated example of the above, reference is made to FIG. 8 where 45 die areas have been formed on wafer 5. Each die area 3 (having a length A and a height B) comprises one or more (preferably released) microstructures. In the case of micromirror arrays for projection systems, each die preferably has at least 1000 movable mirrors, and more likely between 1 and 6 million movable elements. Of course, if the microstructure is a DC relay or RF MEMS switch (or even mirrors for an optical switch) there will likely be far fewer than millions of microstructures, more likely less than 100 or even less than 10 (or even a single structure). Of course if there are only a few microstructures in each die area, then the die areas themselves can be made smaller in most cases. Also, the die areas need not be rectangular, though this shape aids in epoxy deposition and singulation.

Figure 9A:
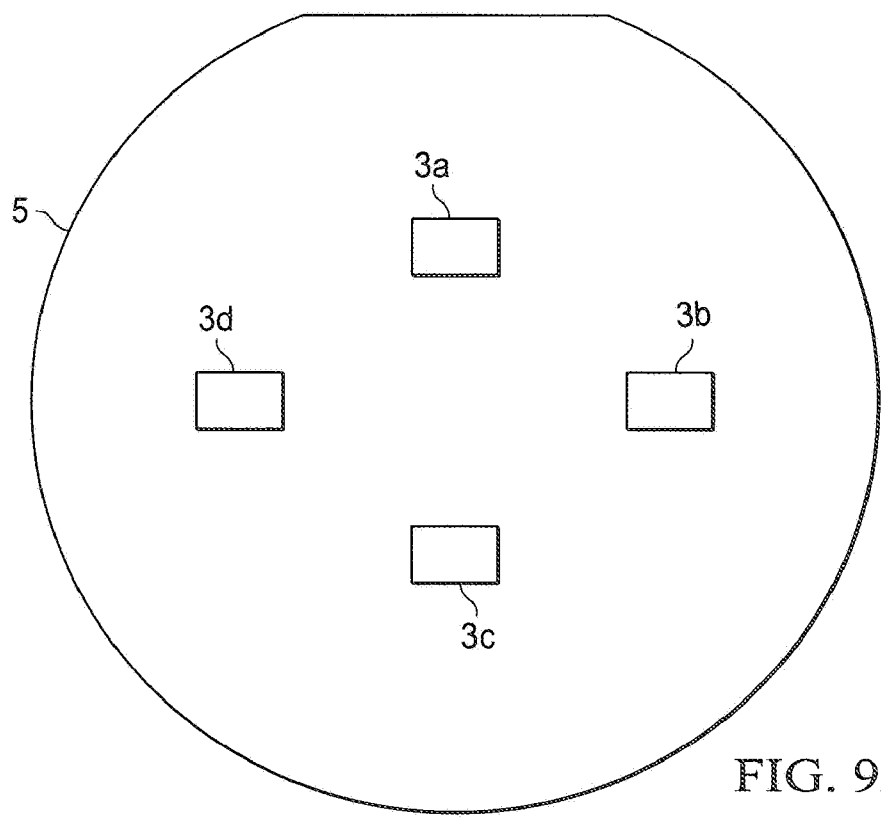
FIGS. 9A to 9E are step-by-step views of the assembly of the device.
Figure 9B:
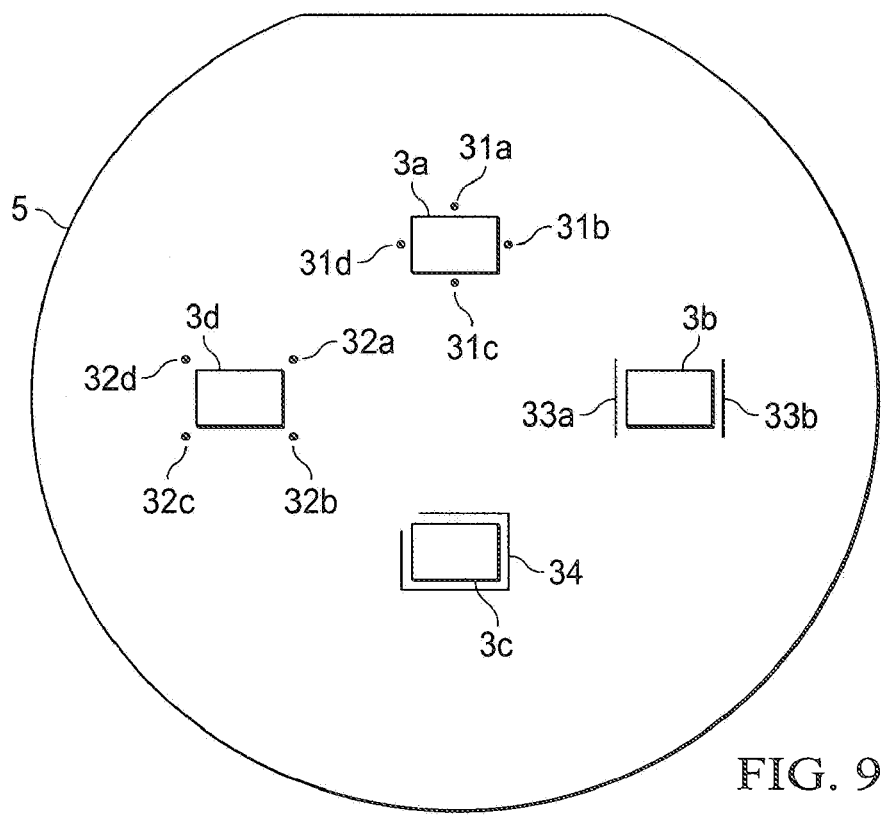

As can be seen in FIG. 9A, four die areas 3a to 3d are formed on wafer 5 (many more dies would be formed in most circumstances, though only four are shown for ease of illustration). Each die area 3a to 3d comprises one or more microstructures which have already been released in a suitable etchant. As illustrated in FIG. 9B, epoxy can be applied in the form of beads 31a to 31d along each side of the die area, or as beads 32a to 32d at each corner of the die area. Or, epoxy ribbons 33a and 33b could be applied along two sides of each die, or a single ribbon 34 could be applied substantially surrounding an entire die. Of course many other configurations are possible, though it is desirable that the die not be fully surrounded with an epoxy gasket as this will prevent air or other gas from escaping when the two wafers are pressed together during a full or partial epoxy cure. And, of course, it is preferable, for higher manufacturing throughput, to use a common epoxy application method throughout the entire wafer (the different types of applications in FIG. 9B are for illustrations purposes only). Also, the areas in which epoxy is applied can first have a sacrificial material deposited in that area (preferably in an area larger than the bead or band of epoxy due to expansion of the epoxy under compression). The sacrificial material could also be applied to the entire wafer except in areas having microstructures thereon. Also, a conductive epoxy (or other adhesive) could be used in order to make electrical contact between the wafer having circuitry and electrodes and the wafer having MEMS thereon.

Figure 9C:
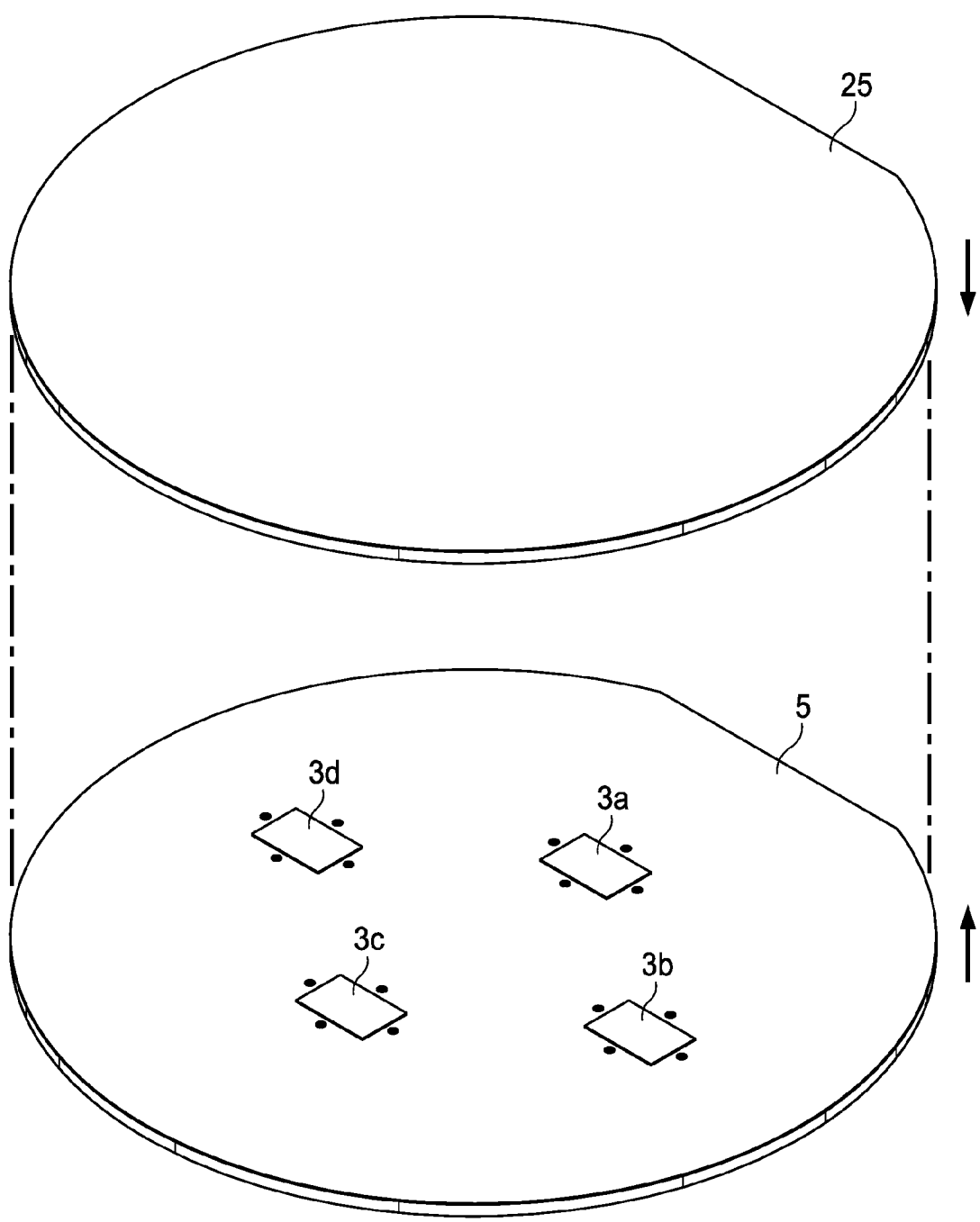

In FIG. 9C, the sealing wafer 25 and the lower substrate wafer 5 with microstructures (and optionally circuitry) are brought into contact with each other. The final gap between the two wafers can be any size that allows the two wafers to be held together and singulated uniformly. Because gasket beads will expand upon application of pressure (thus taking up valuable real estate on a wafer with densely positioned die areas), it is preferable that the gap size be larger than 1 um, and preferably greater than 10 um. The gap size can be regulated by providing microfabricated spacers or spacers mixed in with the epoxy (e.g. 25 um spacers). However, spacers may not be necessary depending upon the type of microstructure and the amount of pressure applied.

Figure 9D:
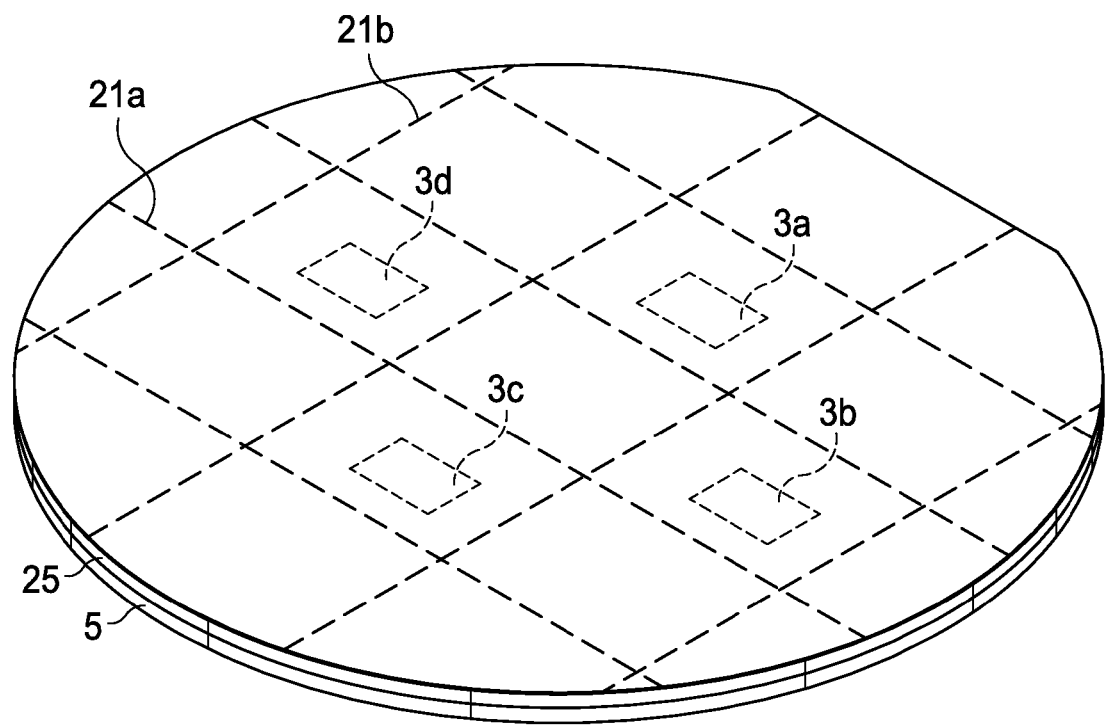
Figure 9E:
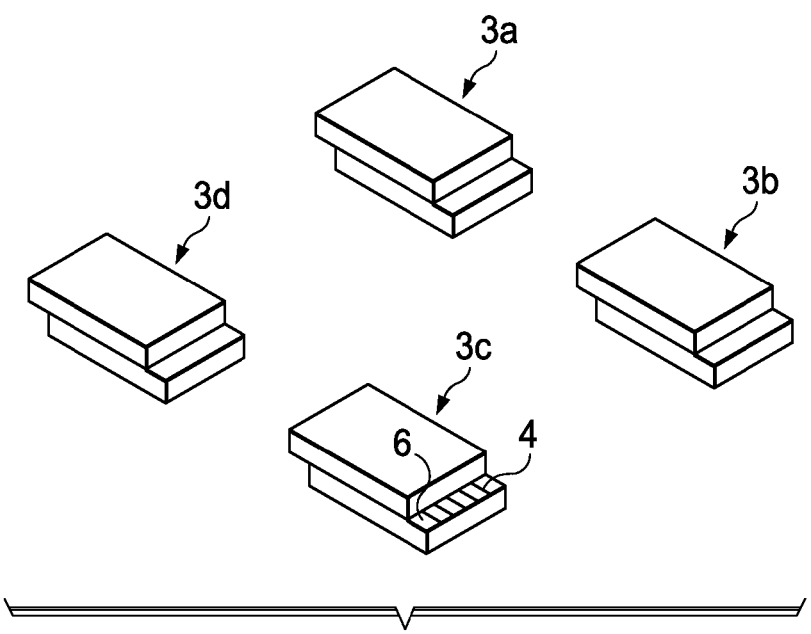

FIG. 9D shows the first wafer 5 and sealing wafer 25 bonded together. Horizontal and vertical score or partial saw lines 21a and 21b are provided on both the sealing wafer 25 and the first (lower) wafer 5 (lines not shown on wafer 5). Preferably the score lines on the two wafers are offset slightly from each other at least in one of the (horizontal or vertical). This offset scoring or partial sawing allows for ledges on each die when the wafer is completely singulated into individual dies (see FIG. 9E). Electrical connections 4 on ledge 6 on die 3c allow for electrical testing of the die prior to removal of the sealing wafer portion. Should the die fail the electrical testing of the microstructures, the sealing wafer need not be removed and the entire die can be discarded.

Referring again to FIG. 5, a top perspective view of a portion of a bonded wafer assembly die 10 is illustrated. Of course, the mirror shapes illustrated in FIGS. 1-5 are exemplary, as many other mirror structures are possible, such as set forth in U.S. patent application Ser. No. 09/732,445 to Ilkov et al. filed Dec. 7, 2000, now U.S. Pat. No. 6,523,961, incorporated herein by reference. For clarity, only four pixel cells 54, 54a, 54b and 54c in a two by two grid configuration are shown in FIG. 5. The pixel cells 54, 54a, 54b and 54c have a pixel pitch of, for example, 12 microns. "Pixel pitch" is defined as the distance between like portions of neighboring pixel cells.

Reflective deflectable elements (e.g., mirrors 48, 48a, 48b and 48c), each corresponding to a respective pixel cell 54, 54a, 54b and 54c, are attached to the lower surface 14 of the optically transmissive substrate 52 in an undeflected position. Thus, mirrors 48, 48a, 48b and 48c are visible through optically transmissive substrate 52 in FIG. 5. For clarity, light blocking aperture layers 56 if present, between the mirrors 48, 48a, 48b or 48c and the optically transmissive substrate 52, are represented only by dashed lines so as to show underlying hinges 50, 50a, 50b and 50c. The distance separating neighboring mirrors may be, for example, 0.5 microns or less.

The optically transmissive substrate 52 is made of materials which can withstand subsequent processing temperatures. The optically transmissive substrate 52 may be, for example, a 4 inch quartz wafer 500 microns thick. Such quartz wafers are widely available from, for example, Hoya Corporation U.S.A at 960 Rincon Circle, San Jose, Calif. 95131. Or, the substrate can be glass such as Corning 1737 or Corning Eagle2000 or other suitable optically transmissive substrate. In a preferred embodiment, the substrate is transmissive to visible light, and can be display grade glass.

As can be seen in FIG. 6, the light transmissive substrate 52 is bonded to e.g. a MOS-type substrate 62 in spaced apart relation due to spacers 44. A plurality of electrodes 63 are disposed adjacent a plurality of micromirrors 64 (mirrors simplified and only 9 illustrated for convenience) for electrostatically deflecting the micromirrors. An incoming light beam 65a will be reflected by a non-deflected mirror at the same angle as it is incident, but will be deflected "vertically" as outgoing light beam 65b when the mirror is deflected. An array of thousands or millions of mirrors selectively moving and deflecting light "vertically" toward projection optics, along with a color sequencer (wheel or prism) that directs sequential beams of different colors onto the mirrors, results in a color image projected on a target (e.g. for projection television, boardroom projectors, etc.).

The method for forming micromirrors as set forth above is but one example of many methods for forming many different MEMS devices (whether with or without an electrical component), in accordance with the present invention. Though the electrical component of the final MEMS device is formed on a separate wafer than the micromirrors in the above example, it is also possible to form the circuitry and micromechanical structures monolithically on the same substrate. The method for forming the MEMS structures could be similar to that described in FIGS. 1-4 if the microstructures are micromirrors (with the difference being that the mirrors are formed on the substrate after forming circuitry and electrodes). Or, other methods for forming circuitry and micromirrors monolithically on the same substrate as known in the art could be used.

Figure 10A:
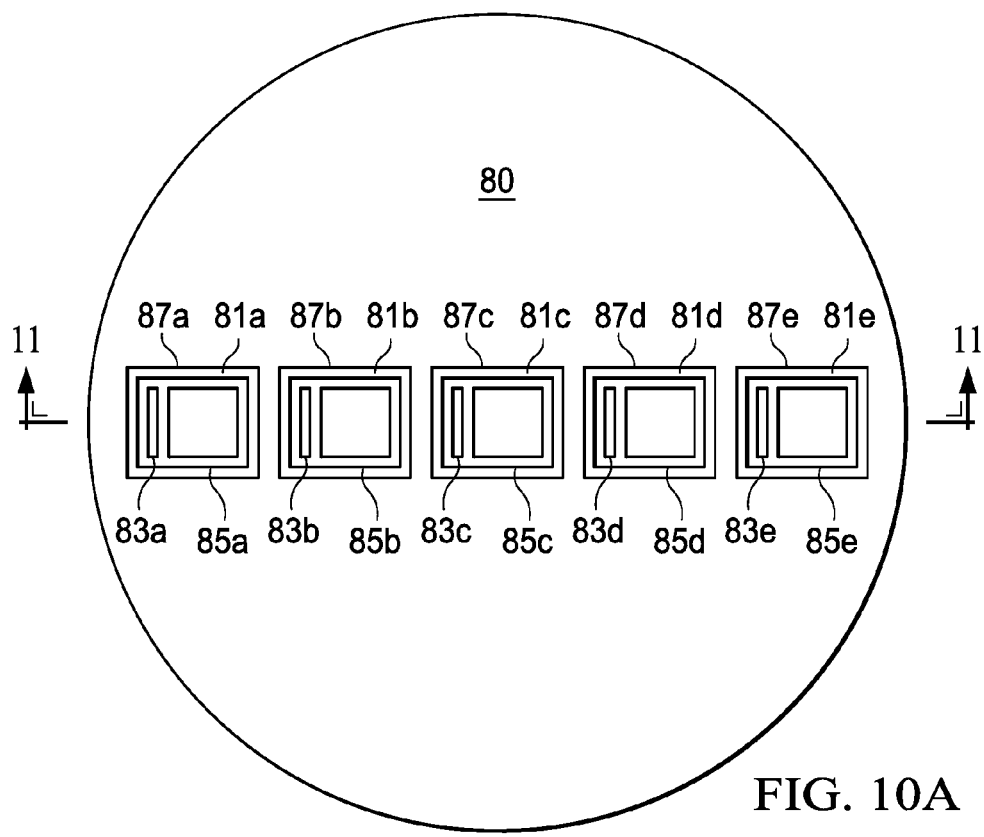
FIGS. 10A and 10B are top views of two wafers that will be joined together and then singulated.
Figure 10B:
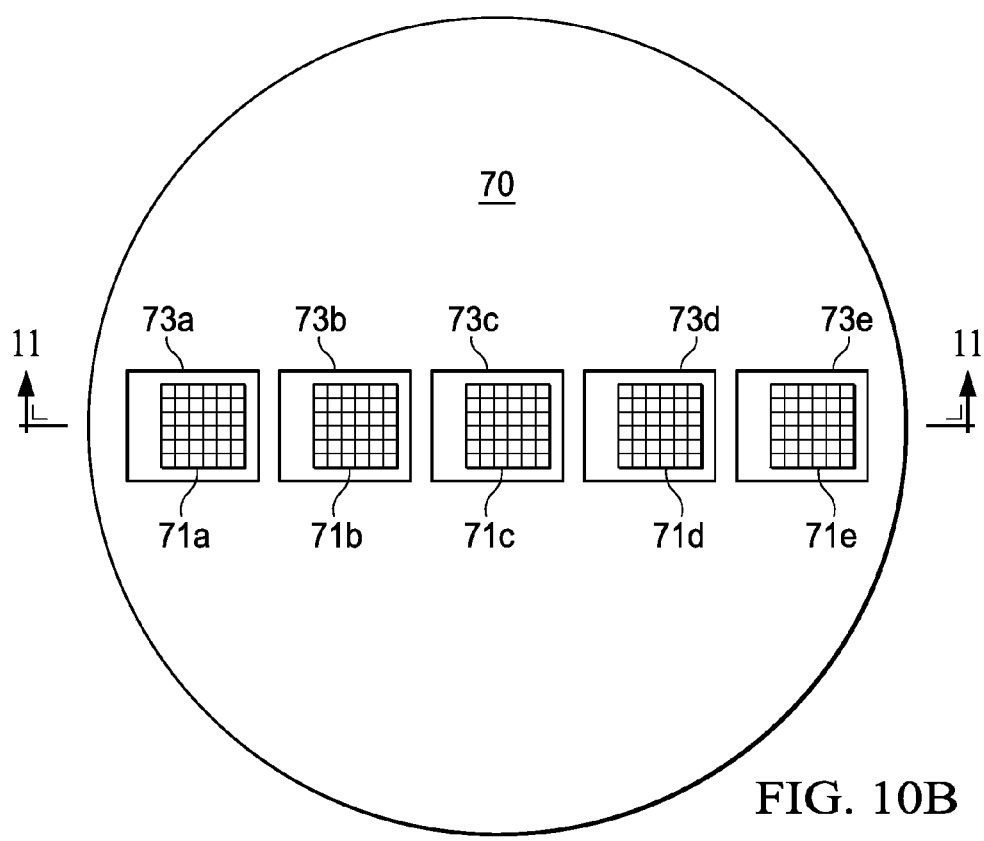

FIGS. 10A and 10B show two wafers that will be joined together and then singulated. FIG. 10A is a top view of a light transmissive cover wafer (having a mask area, getter area, lubricant area and compression metal bonding area) whereas FIG. 10B is an illustration of such a monolithically formed mirror array (e.g. for a spatial light modulator) on a bottom semiconductor wafer (along with a metal area for compression bonding). Referring first to FIG. 10B, a plurality of mirror arrays 71a to 71e are formed on a "bottom" wafer 70 (e.g. a silicon wafer). After the mirrors are released, a metal for compression bonding is applied (areas 73a to 73e) around each mirror array. Of course more arrays could be formed on the wafer (as shown in FIG. 8). On a "top" wafer 80 (e.g. glass or quartz—preferably display grade glass) are formed masks 81a-e which will block visible light around a perimeter area of each die from reaching the mirror arrays after the two wafers are bonded and singulated. Also illustrated in FIG. 10A are areas of lubricant 83a-e, areas of getter material 85a-e, and areas of metal for compression bonding 87a-e. If the wafer of FIG. 10B has been treated with a self assembled monolayer or other lubricant, then the addition of a lubricant on the wafer of FIG. 10A may be omitted if desired (although multiple applications of lubricants can be provided). The lubricant applied to the wafer as a gasket, band or drop on the wafer, can be any suitable lubricant, such as the various liquid or solid organic (or hybrid organic-inorganic materials) set forth in U.S. Pat. Nos. 5,694,740 5,512,374, 6,024,801, and 5,939,785, each of these being incorporated herein by reference. In one embodiment, a trichlorosilane SAM is applied to the entire wafer or large portions of the wafer at least covering the micromechanical elements, and a silicone is applied to the lubricant areas 83a-e. The metal for compression bonding could be any suitable metal for this purpose such as gold or indium. (Alternatively, if an adhesive is used, the adhesive could be any suitable adhesive, such as an epoxy or silicone adhesive, and preferably an adhesive with low outgassing). Of course any combination of these elements could be present (or none at all if the bonding method is other than an adhesive bonding method). Preferably one or more of the mask, lubricant, getter and bonding material are present on the "top" wafer 80 prior to bonding. Also, the lubricant, getter and bonding material could be applied to only the top or bottom wafer or both wafers. In an alternate embodiment, it may be desirable to apply the lubricant and getter to the bottom wafer around the circuitry and electrodes, with bonding material on both wafers. Of course, depending upon the MEMS application, the mask (or the lubricant or getter) may be omitted (e.g. for non-display applications). Also, the bands of lubricant, getter and bonding material need not fully encircle the "die area" on the wafer, but could be applied in strips of dots as illustrated in FIG. 9B. If the bonding material does not fully encircle the MEMS die area, then, prior to singulation, it is preferred that the bonding material "gap" be filled so as to protect the MEMS devices during singulation (from particulate and/or liquid damage depending upon the singulation method).

Figure 10C:
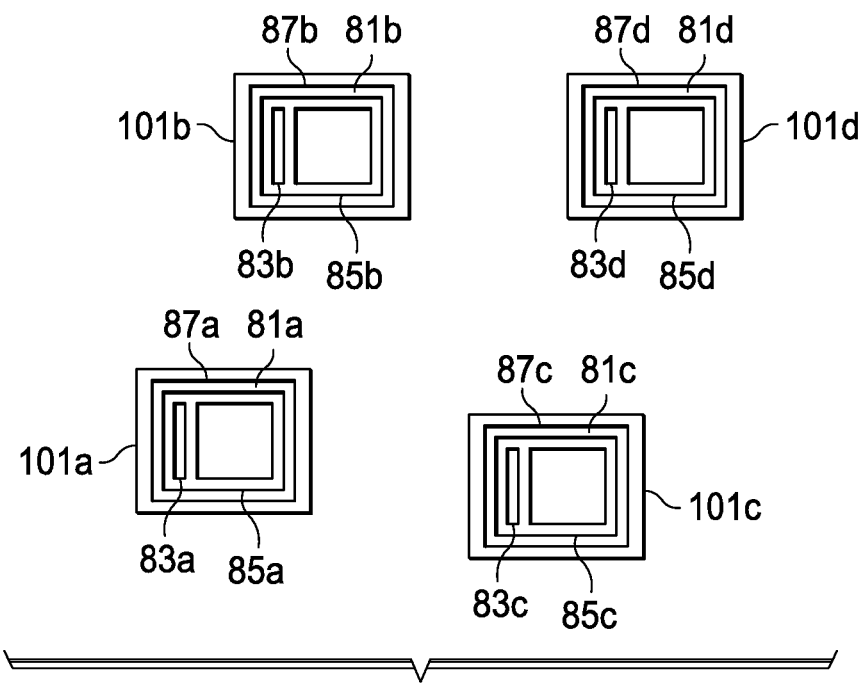
FIGS. 10C and 10D are views of light transmissive substrates (FIG. 10A) for bonding to a wafer (10D)
Figure 10D:
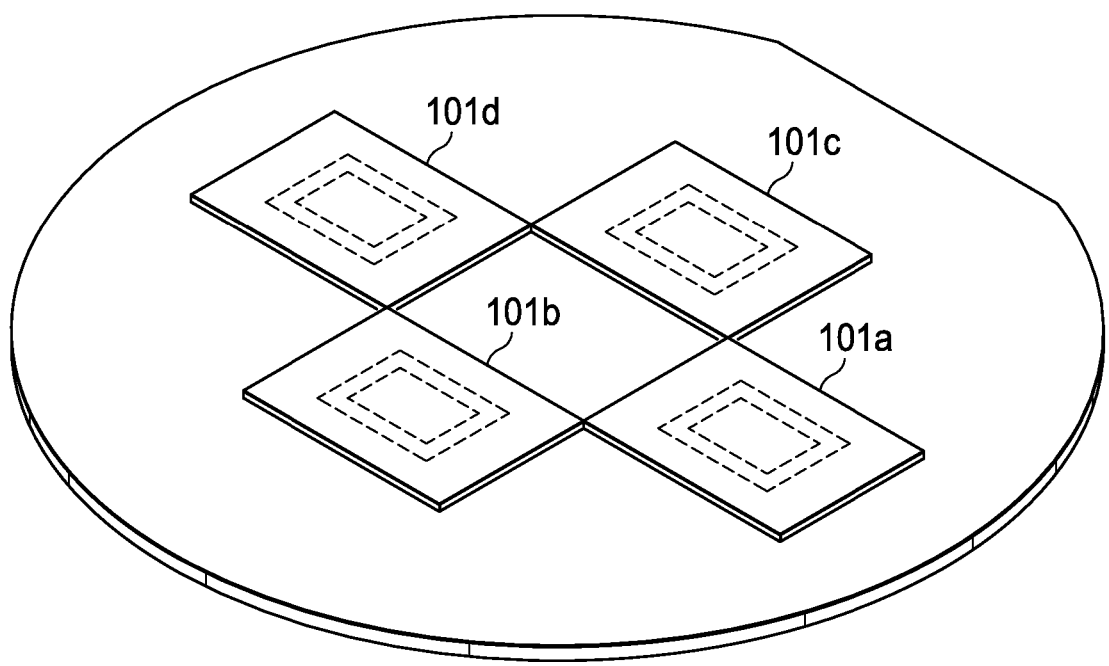

It is also possible to bond multiple substrates (smaller than a single wafer) to another wafer. In the embodiment illustrated in FIGS. 10C and 10D, substrates 101a-d are substrates transmissive to visible light and have thereon masks 81a-d as well as areas of lubricant 83a-d, areas of getter material 85a-d, and areas of bonding material 87a-d (e.g. gold or indium for metal compression bonding. The mask areas are preferably "picture frame" shaped rectangular areas that block the transmission of visible light. This arrangement is desirable for selectively blocking light incident on micromirror arrays formed on the wafer. After bonding the multiple substrates with mask areas to the wafer, the wafer is singulated into wafer assembly portions, followed by packaging such as in FIG. 12.

The MEMS wafers could be made of any suitable material, depending upon the final application for the devices, including silicon, glass, quartz, alumina, GaAs, etc. Silicon wafers can typically be processed to include circuitry. For an optical MEMS application (e.g. micromirrors for optical switching or for displays), the "top" wafer of FIG. 10A is preferably transparent, as mentioned above. The mask illustrated in FIG. 10A, can be an absorptive or reflective mask, such as one made from TiN, AlN, or other oxide or nitride compound, or polymers or other suitable materials having sufficient light blocking capabilities. This "top" wafer could also incorporate other optical elements, such as lenses, UV or other types of filters or antireflection and/or antiscratch coatings.

Figure 11A:
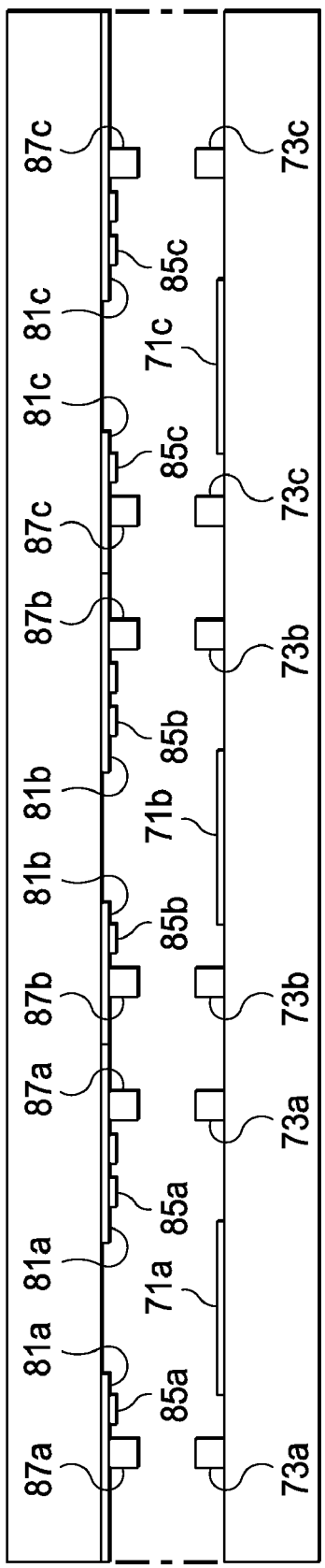
Figure 11B:
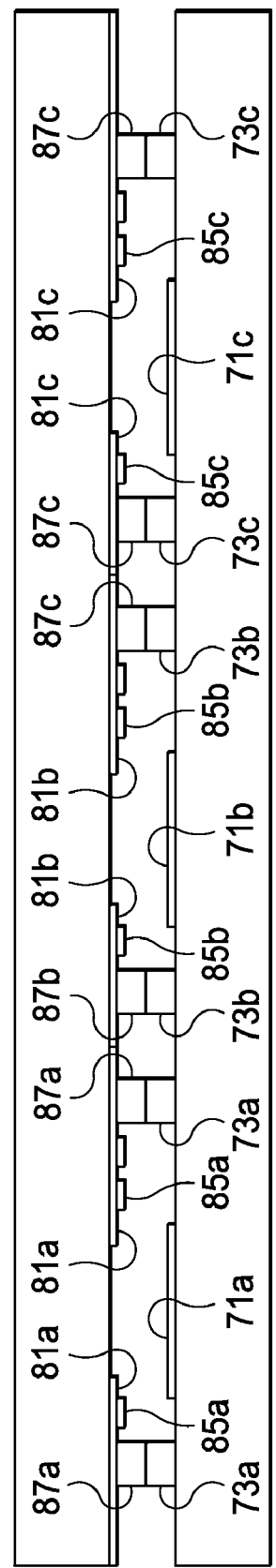
FIG. 11B is the same cross sectional view after bonding of the two wafers, but prior to singulation.
Figure 12:
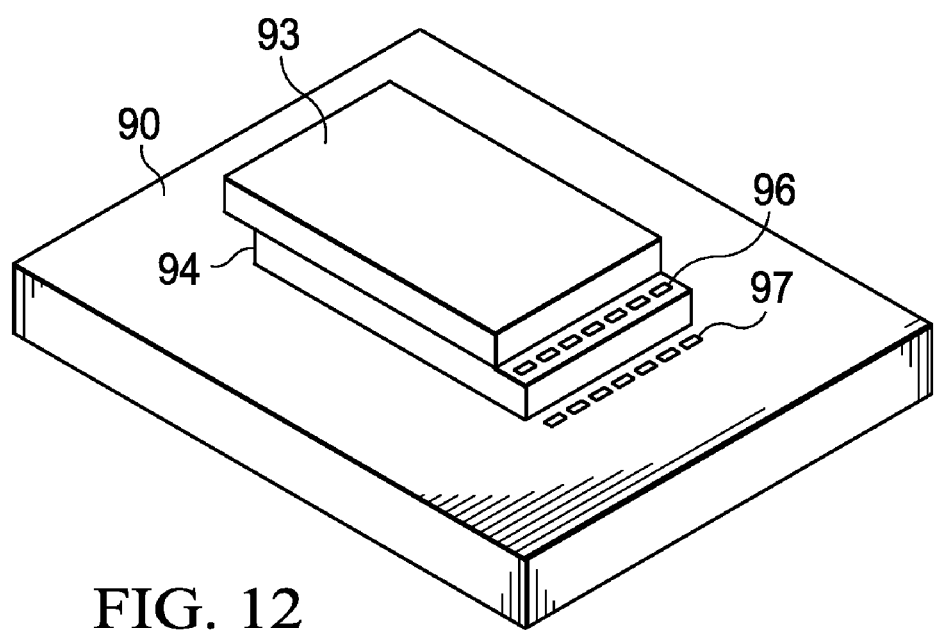
FIG. 12 is an isometric view of a singulated wafer assembly die held on a package substrate.

Then, the two wafers are aligned, bonded, cured (e.g. with UV light or heat depending upon the type of adhesive used) and singulated as set forth above. FIG. 11A is a cross section taken along line 11-11 in FIG. 10A (after alignment with bottom wafer 70 in FIG. 10B), whereas FIG. 10B is the same cross section after bonding (but before singulation). FIG. 12 is an illustration of a packaged wafer assembly portion after singulation of the bonded wafers. As can be seen in FIG. 12, a lower substrate 94 is bonded to the upper substrate 93, with the lower substrate held on a lower packaging substrate 90. Metal areas 96 on lower wafer portion 94 will be electrically connected to metal areas 97 on the package substrate 90. As can be seen in this figure, unlike other MEMS packaging configurations, there is no need to further encapsulate or package the wafer assembly die formed of substrates 93 and 94, as the MEMS elements are already protected within the wafer assembly. This packaging can be desirable for a monolithic MEMS device where both the circuitry and MEMS elements are on the same substrate, as well as where the MEMS elements are formed on a substrate different from the circuitry.

There are many alternatives to the method of the present invention. In order to bond the two wafers, epoxy can be applied to the one or both of the upper and lower wafers. In a preferred embodiment, epoxy is applied to both the circumference of the wafer and completely or substantially surrounding each die/array on the wafer. Spacers can be mixed in the epoxy so as to cause a predetermined amount of separation between the wafers after bonding. Such spacers hold together the upper and lower wafers in spaced-apart relation to each other. The spacers act to hold the upper and lower wafers together and at the same time create a space in which the movable mirror elements can move. Alternatively, the spacer layer could comprise walls or protrusions that are micro-fabricated. Or, one or more wafers could be bonded between the upper and lower wafers and have portions removed (e.g. by etching) in areas corresponding to each mirror array (thereby providing space for deflection of the movable elements in the array). The portions removed in such intermediate wafers could be removed prior to alignment and bonding between the upper and lower wafers, or, the wafer(s) could be etched once bonded to either the upper or lower wafer. If the spacers are micro-fabricated spacers, they can be formed on the lower wafer, followed by the dispensing of an epoxy, polymer, or other adhesive (e.g. a multi-part epoxy, or a heat or UV-cured adhesive) adjacent to the micro-fabricated spacers. The adhesive and spacers need not be co-located, but could be deposited in different areas on the lower substrate wafer. Alternative to glue, a compression bond material could be used that would allow for adhesion of the upper and lower wafers. Spacers micro-fabricated on the lower wafer (or the upper wafer) and could be made of polyimide, SU-8 photo-resist.

Instead of microfabrication, the spacers could be balls or rods of a predetermined size that are within the adhesive when the adhesive is placed on the lower wafer. Spacers provided within the adhesive can be made of glass or plastic, or even metal so long as the spacers do not interfere with the electrostatic actuation of the movable element in the upper wafer. Regardless of the type of spacer and method for making and adhering the spacers to the wafers, the spacers are preferably from 1 to 250 microns, the size in large part depending upon the size of the movable mirror elements and the desired angle of deflection. Whether the mirror arrays are for a projection display device or for optical switching, the spacer size in the direction orthogonal to the plane of the upper and lower wafers is more preferably from 1 to 100 microns, with some applications benefiting from a size in the range of from 1 to 20 microns, or even less than 10 microns.

Regardless of whether the microstructures and circuitry are formed on the same wafer or on different wafers, when the microstructures are released by removal of the sacrificial layer, a sticking force reducing agent can be applied to the microstructures (micromirrors, microrelays, etc) on the wafer to reduce adhesion forces upon contact of the microstructures with another layer or structure on the same or opposing substrate. Though such adhesion reducing agents are known, in the present invention the agent is preferably applied to the wafer before wafer bonding (or after wafer bonding but before singulation), rather than to the singulated die or package for the die. Various adhesion reducing agents, including various trichlorosilanes, and other silanes and siloxanes as known in the art for reducing stiction for micro electromechanical devices, as mentioned elsewhere herein.

Also, a getter or molecular scavenger can be applied to the wafer prior to wafer bonding as mentioned above. The getter can be a moisture, hydrogen, particle or other getter. The getter(s) is applied to the wafer around the released MEMS structures (or around, along or adjacent an array of such structures, e.g. in the case of a micromirror array), of course preferably not being in contact with the released structures. If a moisture getter is used, a metal oxide or zeolite can be the material utilized for absorbing and binding water (e.g. StayDry SD800, StayDry SD1000, StayDry HiCap2000—each from Cookson Electronics). Or, a combination getter could be used, such as a moisture and particle getter (StayDry GA2000-2) or a hydrogen and moisture getter (StayDry H2-3000). The getter can be applied to either wafer, and if adhesive bonding is the bonding method, the getter can be applied adjacent the epoxy beads or strips, preferably between the epoxy and the microstructures, and can be applied before or after application of the adhesive (preferably before any adhesive is applied to the wafer(s)).

As can be seen from the above, the method of the present invention comprises making a MEMS device, e.g. a spatial light modulator, by providing a first wafer, providing a second wafer, forming circuitry and a plurality of electrodes on the first wafer, forming a plurality of deflectable elements on or in either the first or second wafer, aligning the first and second wafers, bonding the first and second wafers together to form a wafer assembly, separating the wafer assembly into individual dies, and packaging the individual dies. Each die can comprise an array of deflectable reflective elements. The reflective elements correspond to pixels in a direct-view or projection display. The number of reflective elements in each die is from 6,000 to about 6 million, depending upon the resolution of the display.

In the method of the invention, the first wafer is preferably glass, borosilicate, tempered glass, quartz or sapphire, or can be a light transmissive wafer of another material. The second wafer can be a dielectric or semiconductor wafer, e.g. GaAs or silicon. As noted above, the first and second wafers are bonded together with an adhesive (thought metal or anodic bonding are also possible, depending upon the MEMS structure and the type of micromachining.

The releasing can be performed by providing any suitable etchant, including an etchant selected from an interhalogen, a noble gas fluoride, a vapor phase acid, or a gas solvent. And, the releasing is preferably followed by a stiction treatment (e.g. a silane, such as a chlorosilane). Also, a getter can be applied to the wafer before or after the adhesion reducing agent is applied, and before or after an adhesive is applied (if an adhesive bonding method is chosen). Preferably the time from releasing to bonding is less than 12 hours, and preferably less than 6 hours.

As can be seen from the above, when the wafer singulation takes place, each die defining a mirror array (or other MEMS device) is already packaged and sealed from possible contamination, physical damage, etc. In the prior art, when the wafer is divided up into individual dies, the mirrors are still exposed and remain exposed while sent to packaging to finally be enclosed and protected (e.g. under a glass panel). By forming a plurality of mirror arrays directly on a glass wafer, bonding (preferably with epoxy and spacers) the glass wafer to an additional wafer comprising actuation circuitry, and only then cutting the wafer into individual dies/arrays, much greater protection of mirror elements is achieved.

The invention need not be limited to a direct-view or projection display. The invention is applicable to many different types of MEMS devices, including pressure and acceleration sensors, MEMS switches or other MEMS devices formed and released on a wafer. The invention also need not be limited to forming the releasable MEMS elements on one wafer and circuitry on another wafer. If both MEMS and circuitry are formed monolithically on the same wafer, a second wafer (glass, silicon or other material) can be attached at the wafer lever following release of the MEMS devices but prior to dividing the wafers into individual dies. This can be particularly useful if the MEMS devices are micromirrors, due to the fragility of such elements.

Though the invention is directed to any MEMS device, specific mirrors and methods for projection displays or optical switching could be used with the present invention, such as those mirrors and methods set forth in U.S. Pat. No. 5,835,256 to Huibers issued Nov. 10, 1998; U.S. Pat. No. 6,046,840 to Huibers issued Apr. 4, 2000; U.S. patent application Ser. No. 09/767,632 to True et al. filed Jan. 22, 2001 now abandoned; Ser. No. 09/564,069 to Richards filed May 3, 2000; Ser. No. 09/617,149 to Huibers et al. filed Jul. 17, 2000 now U.S. Pat. No. 6,337,760; Ser. No. 09/631,536 to Huibers et al. filed Aug. 3, 2000 now U.S. Pat. No. 6,529,310; Ser. No. 09/626,780 to Huibers filed Jul. 27, 2000; 60/293,092 to Patel et al. filed May 22, 2001; Ser. No. 09/637,479 to Huibers et al. filed Aug. 11, 2000 now abandoned; and 60/231,041 to Huibers filed Sep. 8, 2000. If the MEMS device is a mirror, the particular mirror shapes disclosed in U.S. patent application Ser. No. 09/732,445 to Ilkov et al. filed Dec. 7, 2000 could be used. Also, the MEMS device need not be a micromirror, but could instead be any MEMS device, including those disclosed in the above applications and in application 60/240,552 to Huibers filed Dec. 13, 2000. In addition, the sacrificial materials, and methods for removing them, could be those disclosed in U.S. patent application 60/298,529 to Reid et al. filed Jun. 15, 2001. Lastly, assembly and packaging of the MEMS device could be such as disclosed in U.S. patent application 60/276,222 filed Mar. 15, 2001. Each of these patents and applications is incorporated herein by reference.

The invention has been described in terms of specific embodiments. Nevertheless, persons familiar with the field will appreciate that many variations exist in light of the embodiments described herein.

We claim:

1. A spatial light modulator comprising:
   a lower semiconductor substrate comprising circuitry and electrodes;
   an upper light transmissive substrate bonded in spaced apart relationship to the lower substrate;
   an intermediate substrate disposed between the upper and lower substrates and having an open area for defining a gap between the semiconductor substrate and the light transmissive substrate;
   within the gap being disposed a rectangular active area comprising an array of reflective mirrors, wherein the mirrors have mirror edges that are neither parallel nor perpendicular to edges of the active area;
   a light blocking material on the upper light transmissive substrate and provided as a rectangular mask; and
   wherein the mirrors comprise substantially square mirror plates and torsion hinges that allow the mirror plates to move relative to the upper and lower substrates.

2. The spatial light modulator of claim 1, wherein the semiconductor substrate is a silicon substrate.

3. The spatial light modulator of claim 2, comprising an SRAM cell at each mirror location.

4. The spatial light modulator of claim 2, wherein the torsion hinges have a thickness of 50 Å to 2100 Å.

5. The spatial light modulator of claim 4, wherein the torsion hinges are disposed in a different plane than the mirror plates.

6. The spatial light modulator of claim 5, wherein the mirrors are formed on the semiconductor substrate.

7. The spatial light modulator of claim 6, wherein the semiconductor substrate is a silicon substrate.

8. The spatial light modulator of claim 7, further comprising a getter and lubricant within the gap.

9. The spatial light modulator of claim 8, wherein the gap between the upper and lower substrates is from 1 to 250 um.

10. The spatial light modulator of claim 1, wherein the electrodes are designed to run at 0-5 V.

11. The spatial light modulator of claim 1, that has XGA resolution.

12. The spatial light modulator of claim 1, wherein the substrates are bonded together with an adhesive.

13. The spatial light modulator of claim 12, wherein the substrates are bonded together with an epoxy.

14. The spatial light modulator of claim 13, wherein the epoxy is a UV cured epoxy.

15. The spatial light modulator of claim 12, wherein the adhesive is a UV cured adhesive.

16. The spatial light modulator of claim 1, wherein the mirrors comprise a stiction treatment.

17. The spatial light modulator of claim 1, wherein substrates are anodic bonded together.

18. The spatial light modulator of claim 1, wherein the substrates are solder bonded together.

19. The spatial light modulator of claim 1, wherein the substrates are compression bonded together.

20. The spatial light modulator of claim 1, wherein the mirrors have an anti-stiction layer.

21. The spatial light modulator of claim 1, wherein the light transmissive substrate is bonded with an edge offset from an edge of the silicon substrate leaving an exposed ledge on the silicon substrate.

22. The spatial light modulator of claim 21, wherein bond pads are exposed on the silicon substrate due to the offset bond.

23. The spatial light modulator of claim 22, wherein bond wires are connected to the bond pads on the silicon substrate.

24. The spatial light modulator of claim 23, wherein the mirrors are provided in an array of between 1 and 6 million mirrors.

25. The spatial light modulator of claim 24, wherein the mirrors are disposed within the rectangular active area which corresponds to viewed pixels on a screen.

26. The spatial light modulator of claim 1, wherein the circuitry is DRAM circuitry.

27. The spatial light modulator of claim 1, further comprising a getter disposed on the light transmissive substrate.

28. The spatial light modulator of claim 27, further comprising a lubricant which is an organic lubricant.

29. The spatial light modulator of claim 28, wherein the lower semiconductor substrate is bonded to a lower packaging substrate.

30. The spatial light modulator of claim 29, wherein the semiconductor substrate, the intermediate substrate, the light transmissive substrate and the lower packaging substrate are the package for the spatial light modulator without further encapsulation.

31. The spatial light modulator of claim 1, further comprising a lubricant which is an organic lubricant.

32. The spatial light modulator of claim 1, further comprising a getter disposed within the gap.

33. The spatial light modulator of claim 32, wherein the getter is a moisture getter.

34. The spatial light modulator of claim 32, wherein the getter is a particle getter.

35. The spatial light modulator of claim 32, wherein the getter is a hydrogen getter.

36. The spatial light modulator of claim 32, wherein the getter is a metal oxide getter.

37. The spatial light modulator of claim 32, wherein the getter is a zeolite getter.

38. The spatial light modulator of claim 1, wherein the mirrors comprise a self assembled monolayer.

39. The spatial light modulator of claim 1, further comprising a combination getter within the gap.

40. The spatial light modulator of claim 1, wherein the intermediate substrate comprises a plurality of substrate layers.

41. The spatial light modulator of claim 1, wherein the number of mirrors is from 6,000 to about 6 million within the active area.

42. The spatial light modulator of claim 41, wherein the light transmissive substrate is glass.

43. The spatial light modulator of claim 1, wherein the mirror edges are approximately 45 degrees relative to the active area edges.

44. The spatial light modulator of claim 1, wherein each mirror has a switching axis that is at a non-parallel and non-perpendicular angle to at least one edge of the mirror.

45. The spatial light modulator of claim 1, wherein each mirror has a switching axis parallel to at least one edge of the active area.

46. The spatial light modulator of claim 45, wherein each mirror has a switching axis at an angle of from 40 to 55 degrees to one or more edges of each mirror.

47. The spatial light modulator of claim 1, wherein each mirror has a front edge that is non-perpendicular to any edge of the active area.

48. The spatial light modulator of claim 1, wherein each mirror is a square mirror having four edges defining the square mirror, wherein the four edges of each mirror are neither parallel nor perpendicular to any edges of the active area.

49. The spatial light modulator of claim 48, wherein addressing rows connect to every other mirror.

50. The spatial light modulator of claim 48, wherein addressing columns connect to every other mirror.

51. The spatial light modulator of claim 48, wherein hinges are disposed below each mirror and are held on support posts.

52. The spatial light modulator of claim 1, wherein the mirrors comprise hinges that extend parallel to the leading and trailing edges of the active area.

53. The spatial light modulator of claim 1, wherein the mirrors have jagged edges.

* * * * *